(12) United States Patent
Suzuki et al.

(10) Patent No.: US 10,879,285 B2
(45) Date of Patent: Dec. 29, 2020

(54) SOLID-STATE IMAGE PICKUP DEVICE TO INCREASE AN AREA EFFICIENCY OF A SILICON INTERFACE ON THE TRANSISTOR ELEMENT SIDE AND ELECTRONIC APPARATUS

(71) Applicant: SONY SEMICONDUCTOR SOLUTIONS CORPORATION, Kanagawa (JP)

(72) Inventors: Ryoji Suzuki, Kanagawa (JP); Yorito Sakano, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 363 days.

(21) Appl. No.: 15/755,643

(22) PCT Filed: Aug. 26, 2016

(86) PCT No.: PCT/JP2016/075028
§ 371 (c)(1),
(2) Date: Feb. 27, 2018

(87) PCT Pub. No.: WO2017/043343
PCT Pub. Date: Mar. 16, 2017

(65) Prior Publication Data
US 2020/0235151 A1    Jul. 23, 2020

(30) Foreign Application Priority Data

Sep. 11, 2015 (JP) ................................. 2015-179206

(51) Int. Cl.
*H04N 5/335* (2011.01)
*H01L 27/146* (2006.01)
(Continued)

(52) U.S. Cl.
CPC .... *H01L 27/14614* (2013.01); *H01L 27/1464* (2013.01); *H01L 27/14641* (2013.01);
(Continued)

(58) Field of Classification Search
CPC .......... H01L 27/14614; H01L 27/1464; H01L 27/14641; H01L 27/14645; H04N 5/355; H04N 5/3745; H04N 5/378
(Continued)

(56) References Cited

U.S. PATENT DOCUMENTS

2004/0140527 A1* 7/2004 Furuya .................... H01L 28/40
257/532
2006/0208285 A1* 9/2006 Inoue ................ H01L 27/14641
257/239

(Continued)

FOREIGN PATENT DOCUMENTS

| CN | 1835245 A | 9/2006 |
|---|---|---|
| CN | 1965572 A | 5/2007 |

(Continued)

OTHER PUBLICATIONS

International Search Report and Written Opinion of PCT Application No. PCT/JP2016/075028, dated Nov. 8, 2016, 10 pages.

*Primary Examiner* — Usman A Khan
(74) *Attorney, Agent, or Firm* — Chip Law Group

(57) ABSTRACT

A PD unit has a Tr-side Si/SiO2 interface formed to be p-type, and has an embedded PD. The PD, which is n-type, performs photoelectric conversion, and accumulates an electrical charge. A TG transfers the electrical charge accumulated in the PD to an FD. An Amp is connected to the FD. An RST is connected to a Reset Drain (RD), and resets the FD. An FDG is a conversion-efficiency switching switch. An FC is a MOS capacitance (gate electrode) that is connected to the FDG. A SEL selects a pixel that outputs a signal.

15 Claims, 29 Drawing Sheets

(51) Int. Cl.
 *H04N 5/355* (2011.01)
 *H04N 5/3745* (2011.01)
 *H04N 5/378* (2011.01)

(52) U.S. Cl.
 CPC ....... *H01L 27/14645* (2013.01); *H04N 5/355* (2013.01); *H04N 5/378* (2013.01); *H04N 5/3745* (2013.01)

(58) Field of Classification Search
 USPC .......................................... 348/308
 See application file for complete search history.

(56) References Cited

U.S. PATENT DOCUMENTS

| | | | |
|---|---|---|---|
| 2008/0266434 A1 | 10/2008 | Sugawa et al. | |
| 2008/0284889 A1 | 11/2008 | Kinoshita | |
| 2012/0256077 A1 | 10/2012 | Yen et al. | |
| 2014/0151531 A1* | 6/2014 | Yamashita | H01L 23/5223 250/208.1 |
| 2016/0111457 A1* | 4/2016 | Sekine | H01L 27/14614 257/228 |
| 2016/0260759 A1 | 9/2016 | Yamashita | |

FOREIGN PATENT DOCUMENTS

| | | |
|---|---|---|
| CN | 101309349 A | 11/2008 |
| CN | 105556674 A | 5/2016 |
| EP | 1703564 A2 | 9/2006 |
| EP | 1746820 A1 | 1/2007 |
| EP | 1993277 A2 | 11/2008 |
| EP | 2996149 A1 | 3/2016 |
| JP | 49-85975 A | 8/1974 |
| JP | 49-085975 A | 8/1974 |
| JP | 2005-328493 A | 11/2005 |
| JP | 2006-140666 A | 6/2006 |
| JP | 2006-261411 A | 9/2006 |
| JP | 2008-053333 A | 3/2008 |
| JP | 2008-288648 A | 11/2008 |
| JP | 2009-506541 A | 2/2009 |
| JP | 2009-165186 A | 7/2009 |
| JP | 2014-112580 A | 6/2014 |
| JP | 103855174 A | 6/2014 |
| JP | 5604703 B1 | 10/2014 |
| JP | 2015-056408 A | 3/2015 |
| KR | 10-2006-0101187 A | 9/2006 |
| KR | 10-2006-0135941 A | 12/2006 |
| KR | 10-2008-0101698 A | 11/2008 |
| KR | 10-1201269 B1 | 11/2012 |
| KR | 10-2016-0008604 A | 1/2016 |
| TW | 200537684 A | 11/2005 |
| TW | 200904170 A | 1/2009 |
| TW | 201242353 A | 10/2012 |
| WO | 2005/083790 A1 | 9/2005 |
| WO | 2005/101816 A1 | 10/2005 |
| WO | 2015/037547 A1 | 3/2015 |

\* cited by examiner

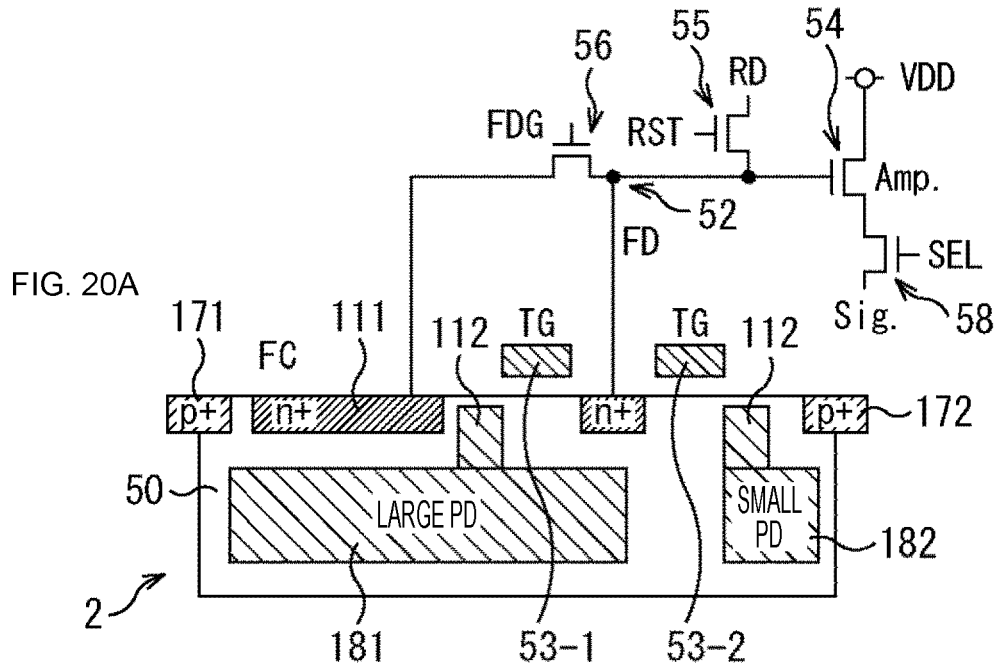
FIG. 20A
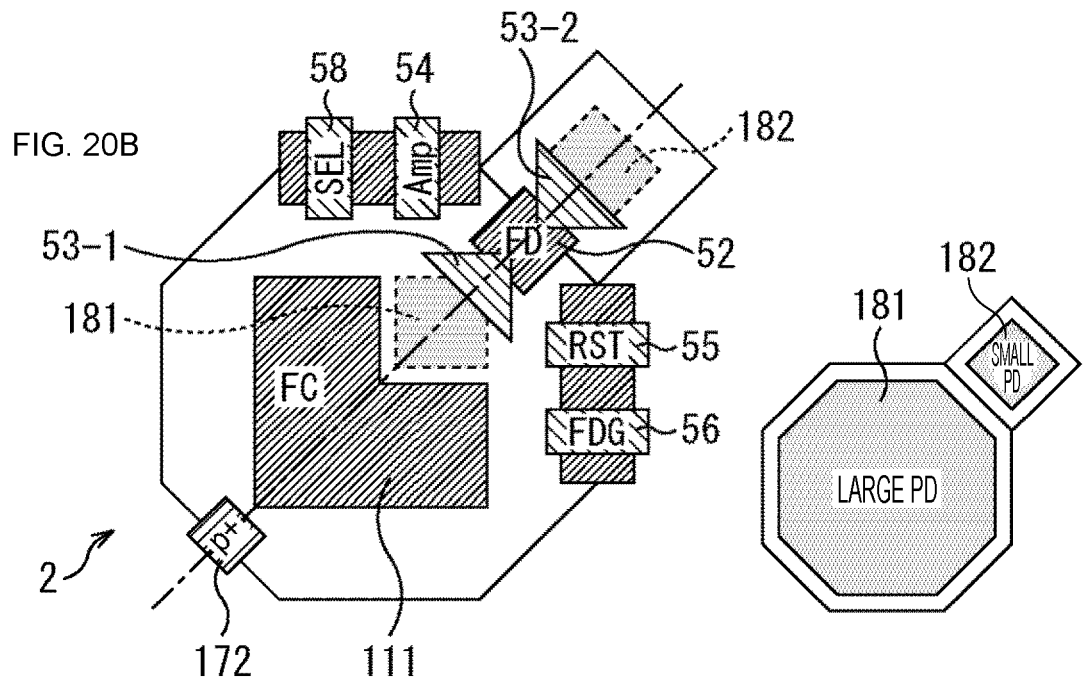
FIG. 20B
FIG. 20C

SOLID-STATE IMAGE PICKUP DEVICE TO INCREASE AN AREA EFFICIENCY OF A SILICON INTERFACE ON THE TRANSISTOR ELEMENT SIDE AND ELECTRONIC APPARATUS

CROSS REFERENCE TO RELATED APPLICATIONS

This application is a U.S. National Phase of International Patent Application No. PCT/JP2016/075028 filed on Aug. 26, 2016, which claims priority benefit of Japanese Patent Application No. JP 2015-179206 filed in the Japan Patent Office on Sep. 11, 2015. Each of the above-referenced applications is hereby incorporated herein by reference in its entirety.

TECHNICAL FIELD

The present disclosure relates to a solid-state image pickup device and an electronic apparatus, and, in particular, relates to a solid-state image pickup device that is capable of increasing an area efficiency of a Si interface on the transistor element side, and an electronic apparatus.

BACKGROUND ART

With respect to C-MOS image sensors each having a conversion-efficiency switching function, a capacitance for low conversion efficiency is mounted to a region having no element as a junction capacitance, a MOS capacitance, or a poly/poly capacitance, and uses a wire capacitance as a load. Alternatively, for example, a method of connecting to an adjacent Floating Diffusion (FD) is used (refer to Patent Documents 1, 2).

CITATION LIST

Patent Document

Patent Document 1: International Publication No. 2005/083790
Patent Document 2: Japanese Translation of PCT International Application Publication No. 2009-506541

SUMMARY OF THE INVENTION

Problems to be Solved by the Invention

These methods may produce the following problems: the larger area is required; the number of wiring line layers increases; and the number of processes increases. Therefore, it is difficult to add a desired large capacity at a low price.

The present disclosure has been devised in consideration of such a situation, and is capable of increasing an area efficiency of a Si interface on the transistor element side.

Solutions to Problems

A solid-state image pickup device according to one aspect of the present technology includes: a photodiode; and a capacitance that is formed on the photodiode.

The capacitance is a MOS capacitance that forms a poly. The capacitance is an n+ electrode on a hole accumulation layer.

During most of a light exposure time period, an electric potential of the electrode can be kept at an electric potential lower than an electric potential obtained when the capacitance is actually used.

When exposure to light is started, a reset drain electric potential is applied, a MOS gate or an n+ electrode, which is the capacitance, is set at a low electric potential through a reset transistor, and subsequently, by switching off a transistor connected between reset drain capacitances, the MOS gate or the n+ electrode can be kept at the low electric potential.

The photodiode is embedded into a deep region of a substrate, and a part used as the capacitance can be separated by putting a distance in a depth direction.

In a case of pixel sharing in which the photodiode is shared by two or more, a top of each photodiode is allocated to a capacitance, a transistor or a well contact.

In a case of the MOS capacitance, the Si side under a MOS gate is formed to be high concentration p-type or n-type, and a region having CV characteristics, and having a satisfactory linearity, can be used.

In a case where the Si side is p-type, p+polySi, PtSi or NiSi can be used as a gate electrode.

In a case where the Si side is p-type, HfO2 or Al2O3 can be used as a gate insulating film.

In a case where the Si side is n-type, n+polySi, TaN or TiN can be used as a gate electrode.

In a case where the Si side is n-type, Y2O3 or La2O3 can used as a gate insulating film.

The linearity is evaluated, and a bent part is corrected in a subsequent stage.

Information about the linearity is recorded, the information being used for the correction.

The solid-state image pickup device is backside-illumination type.

An electronic apparatus according to one aspect of the present technology includes: a solid-state image pickup device including photodiode, and a capacitance that is formed on the photodiode; a signal processing circuit that processes an output signal output from the solid-state image pickup device; and an optical system that enters incident light into the solid-state image pickup device.

According to one aspect of the present technology, including: a photodiode; and a capacitance that is formed on the photodiode.

Effects of the Invention

According to the present technology, an area efficiency of a Si interface on the transistor element side can be increased.

It should be noted that the effects described in the present description are to be construed as merely illustrative, and that effects of the present technology are not limited to those described in the present description, and thus an additional effect may be produced.

BRIEF DESCRIPTION OF DRAWINGS

FIGS. 20A, 20B, and 20C are cross-sectional views illustrating still another configuration example of a pixel (in a case of a configuration including a large-area PD and a small-area PD) according to the present technology.

MODE FOR CARRYING OUT THE INVENTION

Modes for carrying out the present disclosure (hereinafter referred to as embodiments) will be described below. It should be noted that explanations are made in the following order.

1. First Embodiment
2. Second Embodiment (Example of Using Image Sensor)
3. Third Embodiment (Example of Electronic Apparatus)

1. First Embodiment

Schematic Configuration Example of Solid-State Image Pickup Device

Figure 1:
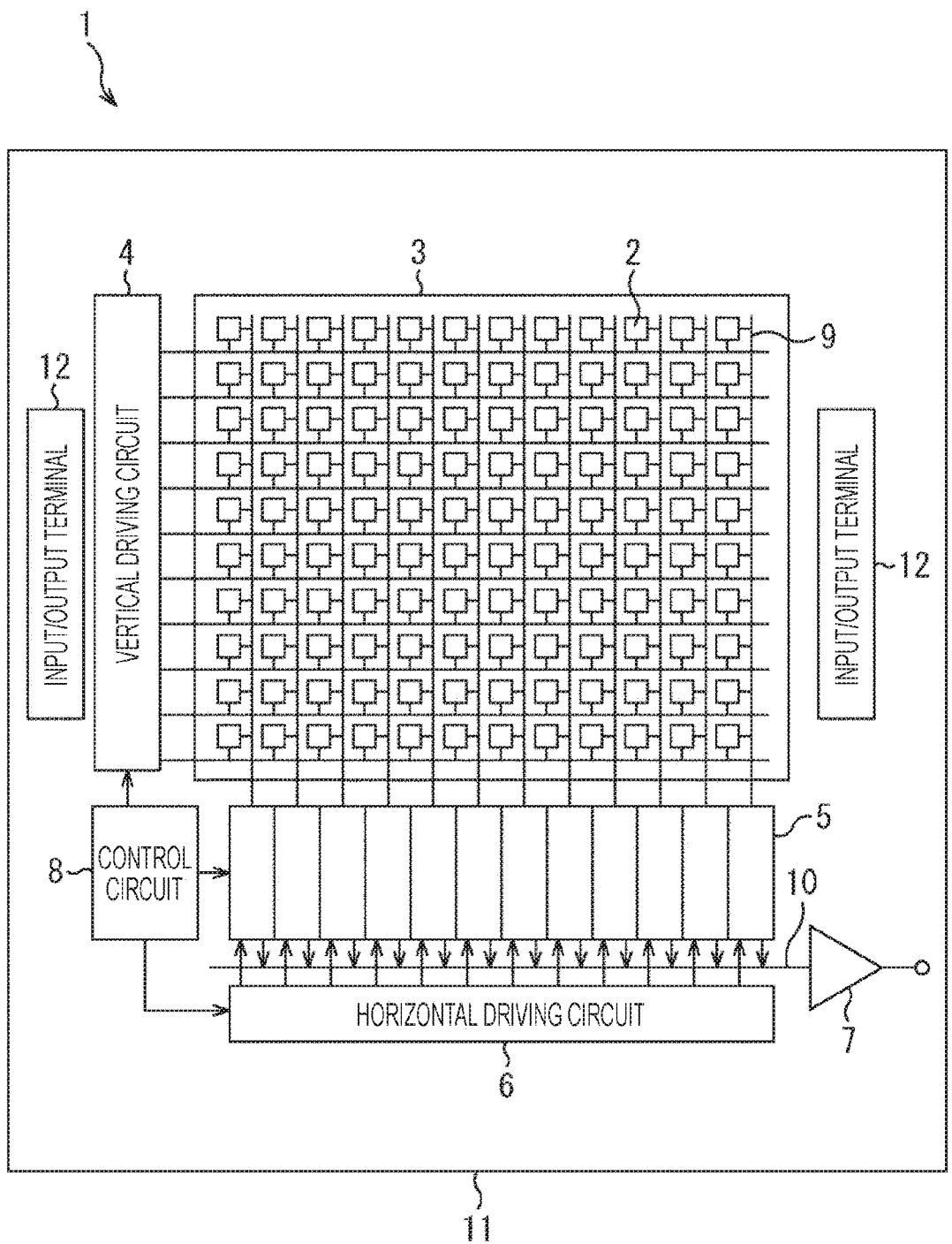
FIG. 1 is a block diagram illustrating a schematic configuration example of a solid-state image pickup device to which the present technology is applied.

FIG. 1 illustrates, as an example, a schematic configuration example of a Complementary Metal Oxide Semiconductor (CMOS) solid-state image pickup device that is applied to each embodiment of the present technology.

As shown in FIG. 1, a solid-state image pickup device (element chip) 1 includes a semiconductor substrate 11 (for example, a silicon substrate) having a pixel region (so-called an image-pickup region) 3 in which pixels 2 each including a plurality of photoelectric conversion elements are regularly and two-dimensionally arranged, and a peripheral circuit region.

The pixel 2 includes a photoelectric conversion element (for example, Photo Diode (PD)), and a plurality of pixel transistors (so-called MOS transistors). Three transistors, which are, for example, a transfer transistor, a reset transistor and an amplification transistor, constitute the plurality of pixel transistors. The plurality of pixel transistors can also be constituted of four transistors by further adding a selection transistor.

In addition, the pixel 2 can also have a pixel sharing structure. The pixel sharing structure includes a plurality of photodiodes, a plurality of transfer transistors, one shared floating diffusion, and other pixel transistors shared one by one. The photodiodes are photoelectric conversion elements.

The peripheral circuit region includes a vertical driving circuit 4, column signal processing circuits 5, a horizontal driving circuit 6, an output circuit 7, and a control circuit 8.

The control circuit 8 receives an input clock, and data that instructs an operation mode or the like, and outputs data such as internal information of the solid-state image pickup device 1. More specifically, on the basis of a vertical synchronizing signal, a horizontal synchronizing signal and a master clock, the control circuit 8 generates a clock signal that functions as a reference of the operations of the vertical driving circuit 4, the column signal processing circuits 5, and the horizontal driving circuit 6, and generates a control signal. Subsequently, the control circuit 8 inputs these signals into the vertical driving circuit 4, the column signal processing circuits 5, and the horizontal driving circuit 6.

The vertical driving circuit 4 includes, for example, a shift register, selects a pixel driving wiring line, supplies the selected pixel driving wiring line with a pulse for driving the pixel 2, and drives the pixel 2 on a line basis. More specifically, the vertical driving circuit 4 sequentially selects and scans each of the pixels 2 in the pixel region 3 on a line basis in the vertical direction, and supplies, through a vertical signal line 9, each of the column signal processing circuits 5 with a pixel signal based on a signal charge generated according to the amount of received light in the photoelectric conversion element of each of the pixels 2.

The column signal processing circuits 5 are arranged corresponding to, for example, respective columns of the pixels 2, and each subject signals output from the pixels 2 in one column to signal processing such as noise removal on a pixel column basis. More specifically, the column signal processing circuits 5 each perform signal processing such as Correlated Double Sampling (CDS) for removing fixed pattern noises specific to the pixels 2, signal amplification, and Analog/Digital (A/D) conversion. A horizontal selection switch (not illustrated) is connected between an output stage of each of the column signal processing circuits 5 and a horizontal signal line 10.

The horizontal driving circuit 6 includes, for example, a shift register, and sequentially outputs a horizontal scanning pulse to select each of the column signal processing circuits 5 in order, which causes the each of the column signal processing circuits 5 to output a pixel signal to the horizontal signal line 10.

The output circuit 7 subjects a signal sequentially supplied from each of the column signal processing circuits 5 through the horizontal signal line 10 to signal processing, and then outputs the signal. There is also a case where the output circuit 7 performs, for example, buffering only; and there is also a case where the output circuit 7 performs black level adjustment, column dispersion correction, various digital signal processing or the like.

The input/output terminal 12 is provided so as to exchange signals with the outside.

Configuration Example of Pixel

Figure 2:
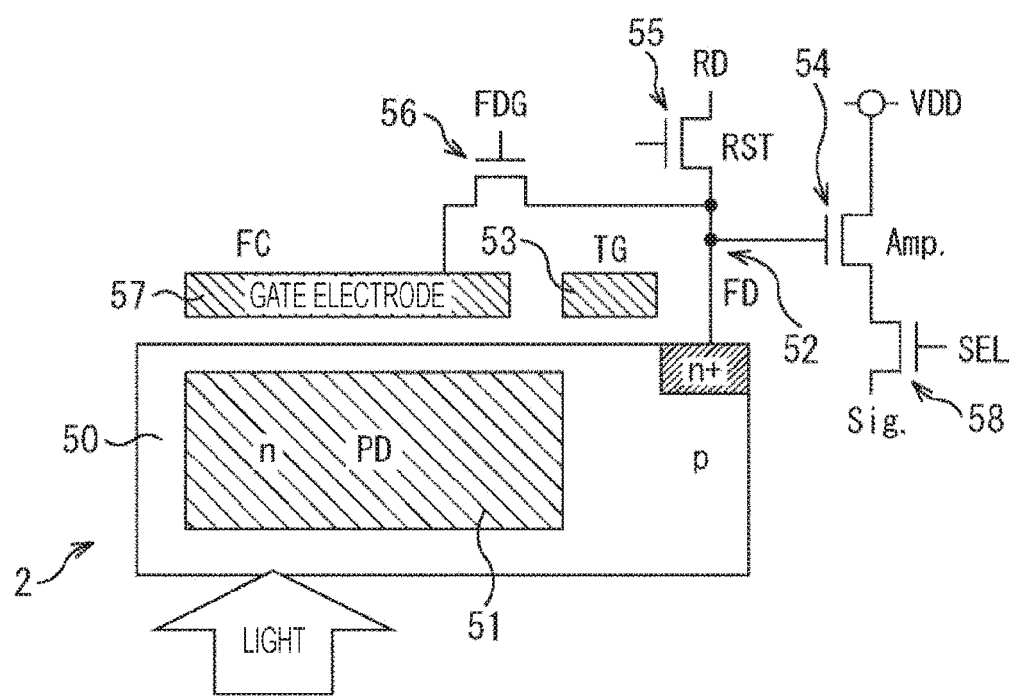
FIG. 2 is a cross-sectional view illustrating a configuration example of a pixel according to the present technology.

FIG. 2 illustrates a configuration example of a pixel according to the present technology. An example of FIG. 2 shows a cross-sectional view of a PD unit in which a p-type MOS capacitance is mounted on a PD as a conversion-efficiency switching capacitance. Light enters from the bottom of the figure because of being backside-illumination type.

A cell configuration of the pixel 2 includes a Floating Diffusion (FD) 52, a Transfer Gate (TG) 53, an Amp 54, a RST 55, an FD Gate (FDG) 56, a Floating Capacitor (FC) 57, and a SEL 58, and includes a PD unit 50 including a PD 51.

The PD unit 50 has a Tr-side Si/SiO2 interface formed to be p-type, and has the embedded PD 51. The PD 51, which is n-type, performs photoelectric conversion, and accumulates an electrical charge. The TG 53 transfers the electrical charge accumulated in the PD 51 to the FD 52. The Amp 54 is connected to the FD 52. The RST 55 is connected to a Reset Drain (RD), and resets the FD 52. The FDG 56 is a conversion-efficiency switching switch. The FC 57 is formed on the PD 51, and is a MOS capacitance (gate electrode) connected to the FDG 56. The SEL 58 selects a pixel that outputs a signal. It should be noted that the SEL 58 is not indispensable.

According to illuminance of an object, the PD unit 50 switches between a low conversion efficiency and a high conversion efficiency. This is performed by switching on/off the FDG 56 to switch a capacitance of the FD 52.

Figure 3:
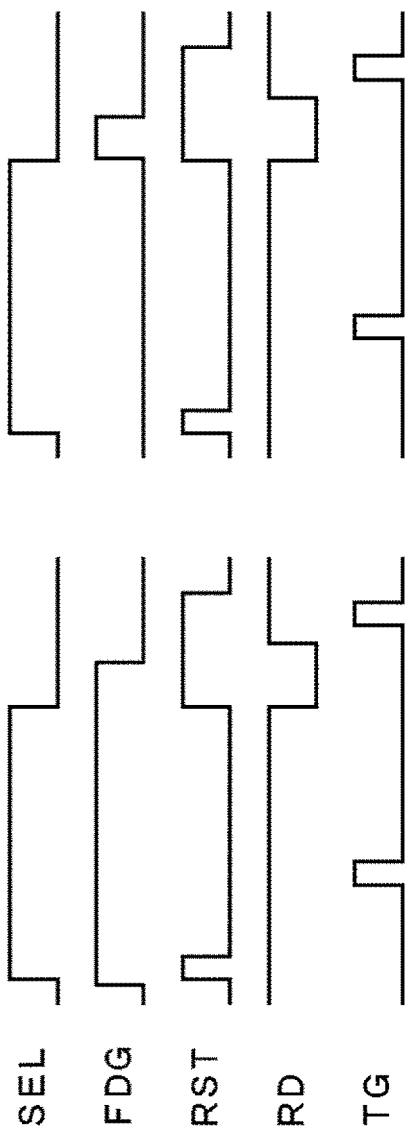
FIGS. 3A, 3B, and 3C are drawings illustrating an example of driving a pixel in FIG. 2.

FIGS. 3A, 3B, and 3C are drawings illustrating an example of driving the pixel shown in FIG. 2. FIG. 3A illustrates an example of driving the pixel in the case of the low conversion efficiency. By switching on the FDG 56, the MOS capacitance (FC 57) is connected to the FD 52, which causes the capacitance of the FD 52 to increase, and consequently the conversion efficiency decreases. A pixel that performs outputting is selected by switching on the SEL 58, and the FD 52 is reset to a High level of the RD. Consequently, a reset level is read, the TG 53 is switched on, a signal charge of the PD 51, which has been photoelectrically converted and has been accumulated, is transferred to the FD 52, a signal level is read, and in each of the column signal processing circuits 5, offset dispersion is eliminated by the CDS.

After the signal is read, the RST 55 is switched on again. By switching the RD to Low in that state, an electric potential of the MOS gate (gate of the FC 57) is changed to a Low level, and the FDG 56 is switched off in that state. As the result, the low level is held in the MOS gate (gate of the FC 57). Subsequently, the RD is returned to a High level. In that case, by switching on/off the TG 53 once, an electrical charge that flows backward to the PD 51 at the time of RD Low is reset. It should be noted that if a Low electric potential of the TG 53 is sufficiently lower than a Low electrical charge of the RD, the operations after reading the signal is not required.

Next, an example of driving at the time of electronic shuttering with low conversion efficiency will be described with reference to FIG. 3C. By switching on the RST 55, and by switching on the TG 53, an electrical charge of the PD 51 is discharged to the FD 52 to empty the PD 51. After the TG 53 is switched off, the RD is changed to Low, and the FDG 56 is switched on. As the result, a gate part of the FC 57 is provided with a Low electric potential (Low electric potential that is lower than the electric potential obtained when the capacitance is actually used). In that state, by switching off the FDG 56 (the transistor connected between reset drain capacitances), the gate part of the FC 57 is held at a Low electric potential. This series of operations cause the MOS gate on the PD 51 to be kept at the Low level during most of a light exposure time period. This enables to prevent a dark current and a white spot from occurring without decreasing a hole concentration of a p-type region on the MOS gate side of the PD 51.

Incidentally, in an example of driving the pixel in the case of the high conversion efficiency, as shown in FIG. 3B, when an electrical charge is read, the FDG 56 is switched off to separate the MOS capacitance (FC 57) from the FD 52. The electronic shuttering operation is the same as the electronic shuttering operation in the case of the low conversion efficiency (FIG. 3C).

Figure 4:
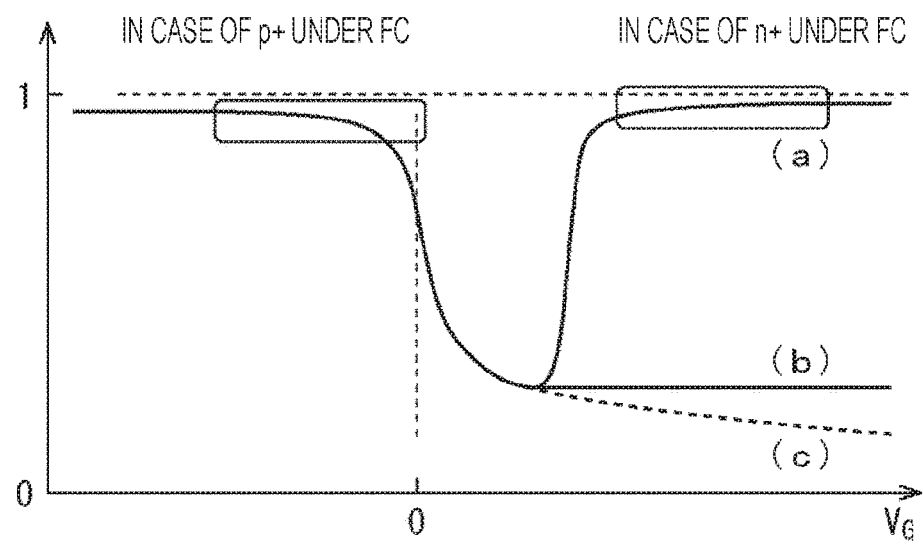
FIG. 4 is a drawing illustrating a relationship between an upper electrode voltage and an electric capacitance, the relationship being indicated by a MOS structure.
Figure 5:
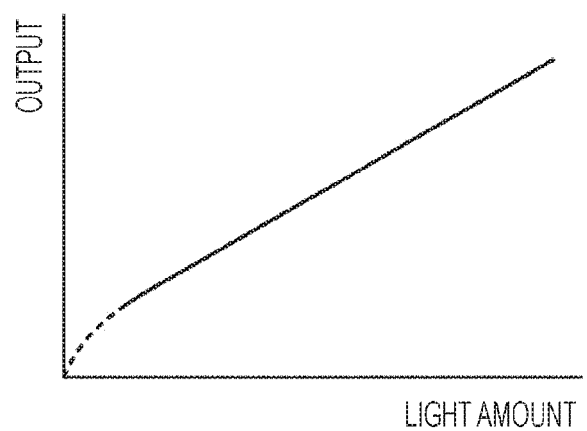
FIG. 5 is a drawing illustrating linearity of an output.

FIG. 4 is a drawing illustrating a relationship between an upper electrode voltage and an electric capacitance, the relationship being indicated by a MOS structure. In an example of FIG. 4, a horizontal axis indicates an electrode voltage of a MOS gate; and a vertical axis indicates an electric capacitance. In a case where p-type is used under the FC 57 (gate), when an electric potential of a gate increases, a Si interface is depleted, and therefore the capacitance decreases. When this region is entered, a conversion efficiency changes, and therefore linearity of the output becomes worse as shown in FIG. 5. In order to prevent this, a flat band voltage is changed to further+side (in other words, a part under the gate is configured to be high concentration p-type), thereby preventing depletion in an operating point. For the above purpose, selecting p+poly, ptSi, NiSi or the like as a gate electrode material, and selecting HfO2, Al2O3 or the like as a gate insulating film, are effective. It should be noted that other than the above, general-purpose SiO2 or SiON can also be selected as a gate insulating film.

Figure 6:
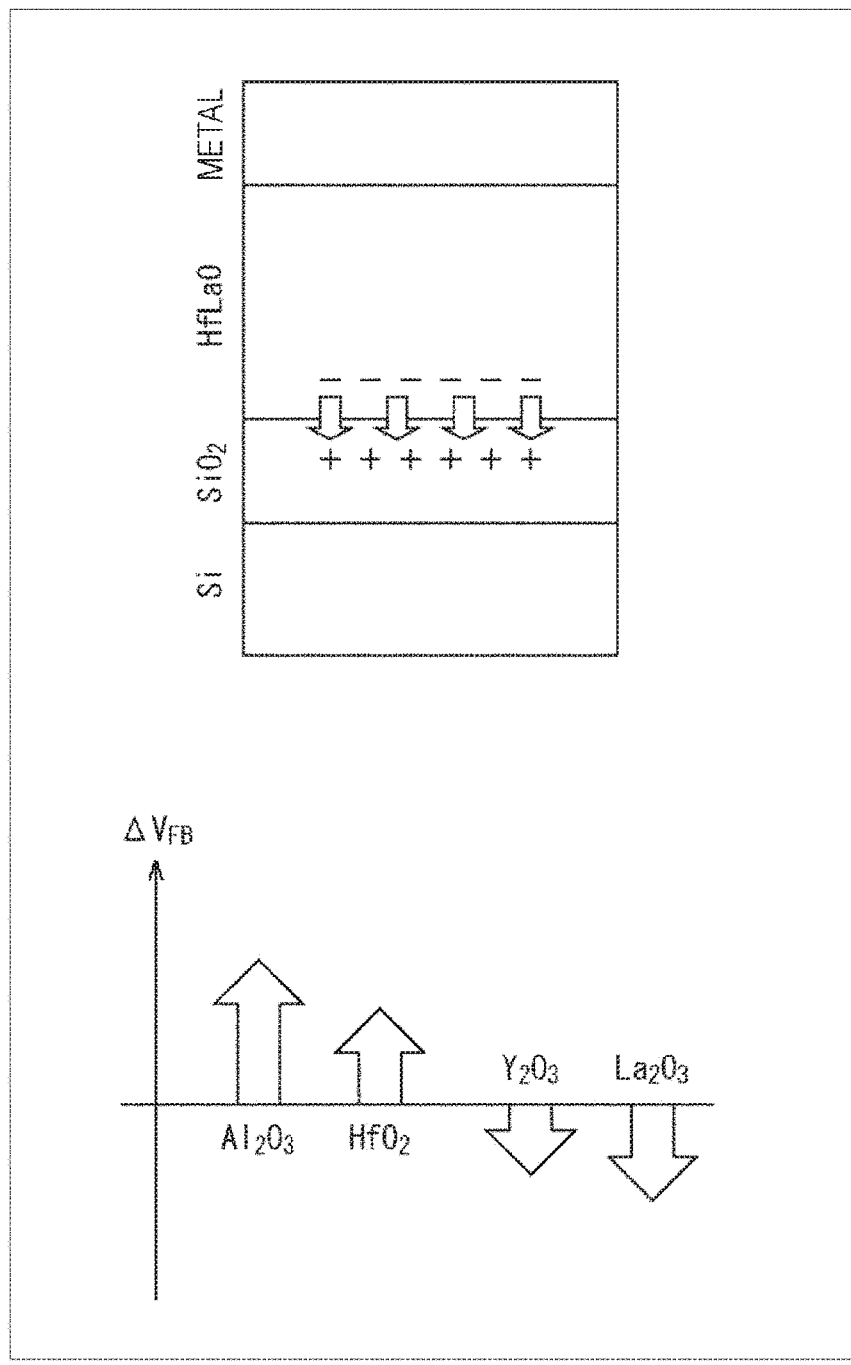
FIG. 6 is a drawing illustrating a change in flat band voltage in a case where various high-k films are layered on a gate insulating film together with SiO2.

An example of FIG. 6 shows a change in flat band voltage in a case where various high-k films are layered on a gate insulating film together with SiO2. It is revealed that if HfO2, Al2O3 or the like is selected as a gate insulating film, the flat band voltage changes to the + side.

Figure 7:
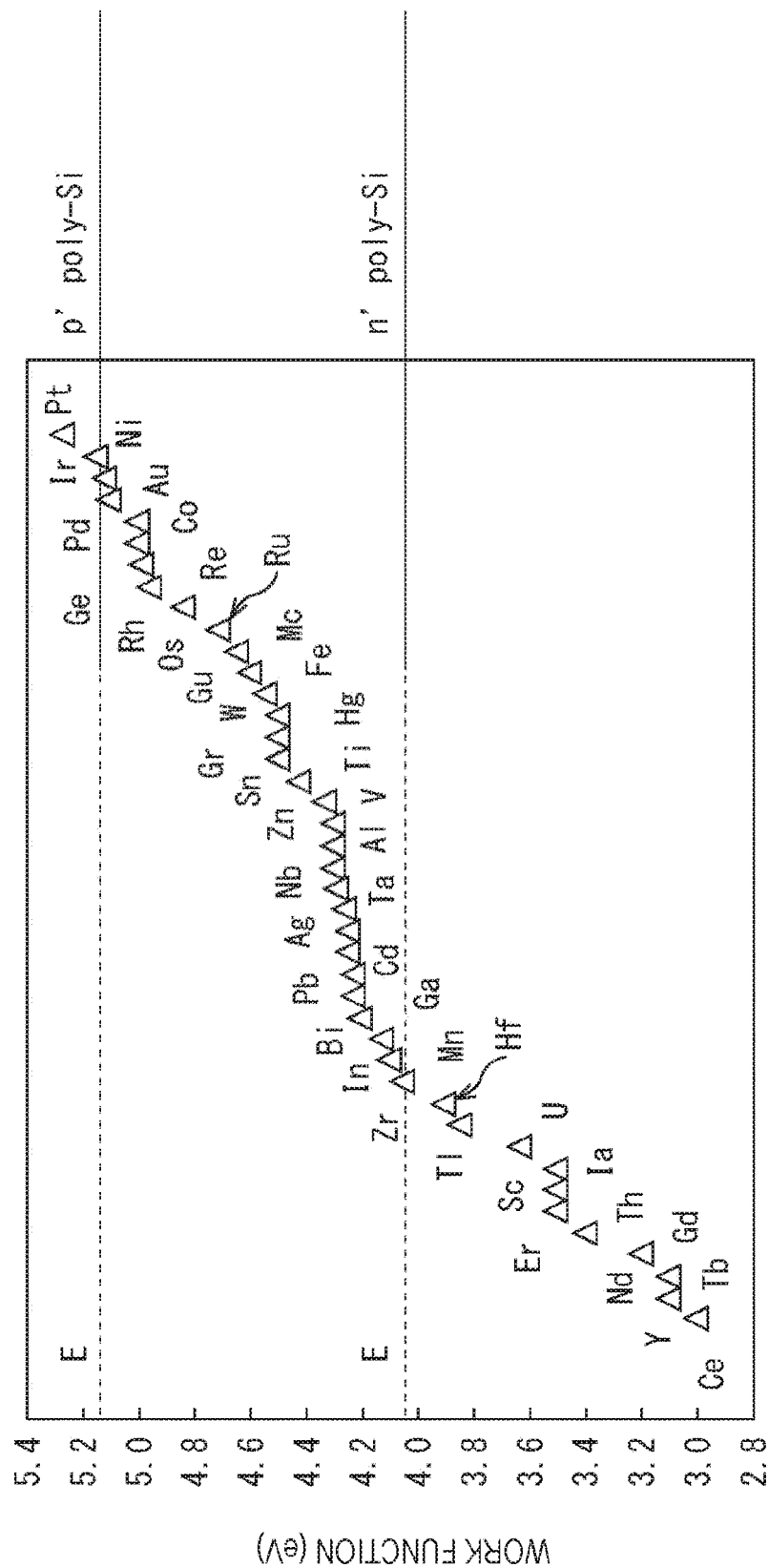
FIG. 7 is a drawing illustrating a work function of various materials used in a gate electrode.

An example of FIG. 7 shows work functions of various materials used in a gate electrode. It is revealed that work functions of Pt and Ni are close to a work function of p+poly.

Configuration Example of Pixel

Figure 8:
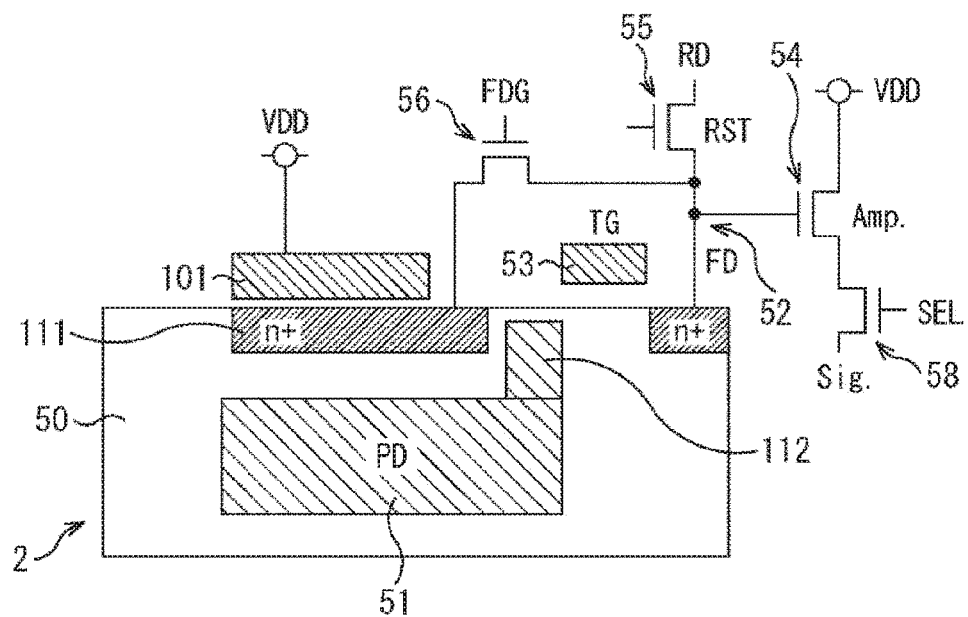
FIG. 8 is a cross-sectional view illustrating another configuration example of a pixel according to the present technology.

FIG. 8 illustrates another configuration example of a pixel according to the present technology. An example of FIG. 8 shows a cross-sectional view of a PD unit in which an n-type MOS capacitance is mounted on a PD as a conversion-efficiency switching capacitance.

The cell configuration of the pixel 2 in FIG. 8 differs from that in the example of FIG. 2 in that the FC 57 that is the p-type MOS capacitance is replaced with an FC 101 that is an n-type MOS capacitance. The other parts of the configuration are shared by FIGS. 2, 3A, 3B, 3C, 4, 5, 6, 7 and 8. In this case, by connecting a power supply voltage VDD to a gate, and by connecting an n+ region 111 to the FD 52 through the FDG 56, a region having a higher linearity in the case of n+ under FC in FIG. 4 can be used. The n+ region 111 is an n+ electrode on a hole accumulation layer. An electric potential on the Si side fluctuates with the gate voltage fixed, and therefore CV characteristics exist not in a high-frequency line (b), but in a curve of a low-frequency line (a).

In this case, in contrast with the case of p-type in FIG. 2, as indicated in each of FIGS. 6 and 7, using a material such as Y2O3 and La2O3 as a gate insulating film, and using a material such as n+poly, TaN and TiN as a gate electrode, are effective, the materials causing a flat band voltage to change to further—side (that is to say, high concentration n-type). It should be noted that other than the above, general-purpose SiO2 or SiON can also be selected as a gate insulating film.

In addition, a Tr-side Si/SIO2 interface of the PD unit 50 is usually formed as a p-type embedded PD 51. Therefore, in order to form an n-type on the p-type, an n+ region 111 of the PD 51 is arranged with the n+ region 111 spaced away from the Tr-side interface, thereby providing a p-type region between the n+ region 111 of the interface and the PD 51. If the TG 53 is spaced away from the PD 51, reading becomes difficult. Therefore, an n-type region 112 for reading a signal charge to the interface side by an implant is provided with the n+ region 111 under the MOS gate (FC 101) avoided.

Figure 9:
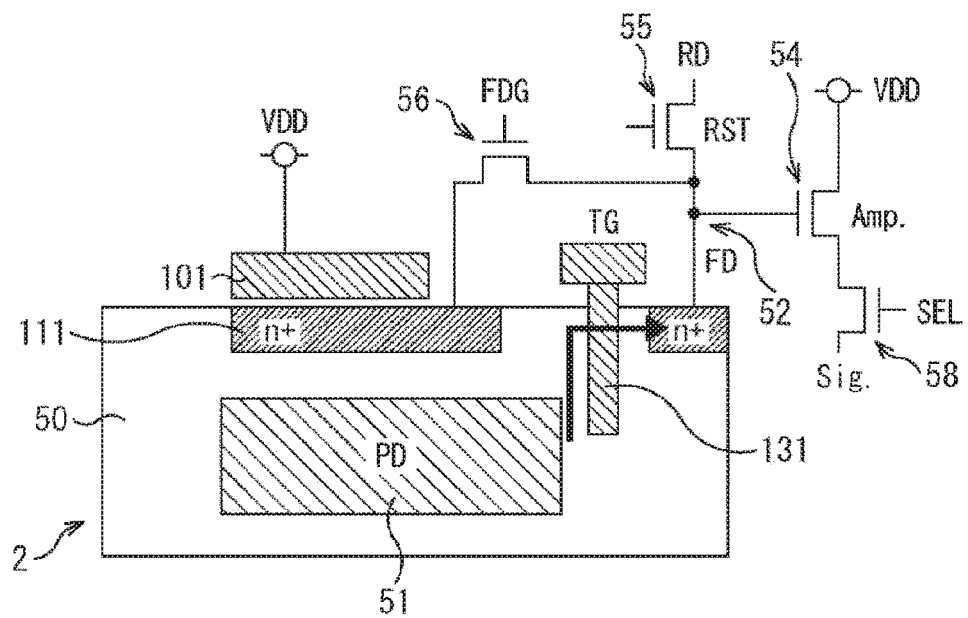
FIG. 9 is a cross-sectional view illustrating still another configuration example of a pixel according to the present technology.
Figure 10:
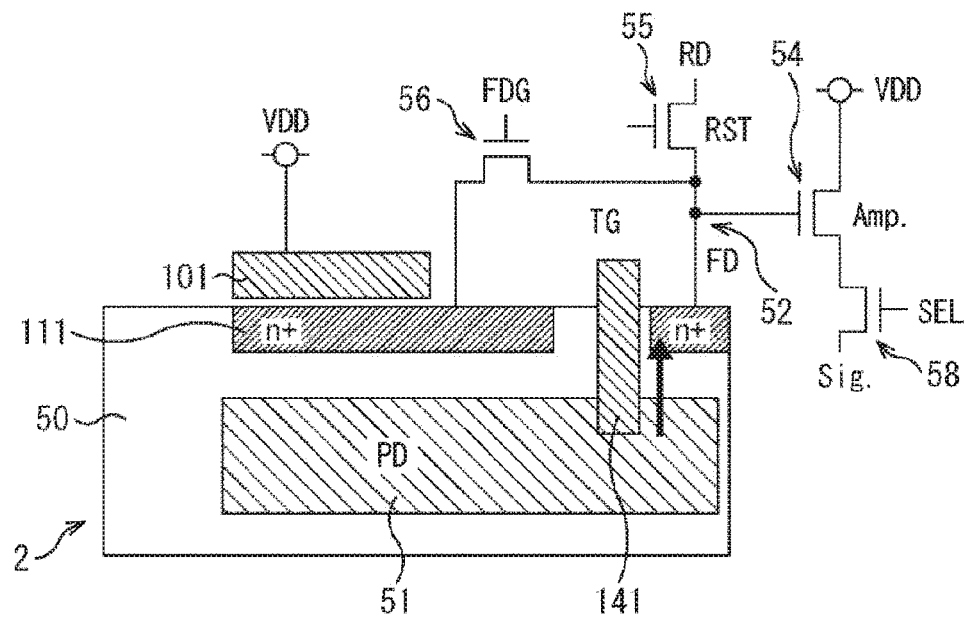
FIG. 10 is a cross-sectional view illustrating a further configuration example of a pixel according to the present technology.

It should be noted that as shown in examples of FIGS. 9 and 10, as an alternative to the TG 53, a vertical Tr (VG: Vertical Gate) configuration may be used as indicated by the TG 131 and the TG 141, thereby bringing the PD 51 close to a TG 131 or a TG 141. As shown in the example of FIG. 10, in the case of an I-shaped TG 141, there is no hammer head part such as that included in the TG 131. Therefore, an n+ diffusion layer of the FD 52 and the vertical Tr gate (TG 141) can be brought close to each other, and accordingly transfer from the PD 51 to the FD 52 is facilitated. Consequently, the flexibility of the configuration region of the PD unit 50 is increased.

In addition, FIG. 10 shows an example in which up to the bottom of the FD 52, as the PD 51, the FD 52 side of the TG 141 is used as a transfer path. Moreover, as shown in FIGS. 8 to 10, in this configuration in which the FD 52 is connected to the diffusion layer side of the MOS capacitance (FC 101), a part between this n+ region 111 and pwell is also added as a junction capacitance. Therefore, a larger capacitance can be obtained. In other words, in the example of FIG. 10, the PD is embedded into a deep region to put a distance in a depth direction, and thus a part used as a capacitance is separated.

During most of the light exposure time period in this configuration, the electric potential of the n+ region 111 is set at a High level so as to be used as a drain of a dark current occurring in a pwell region, the electric potential of the n+ region 111 is set at a low electric potential so as to increase the hole density of the p-type region between the PD 51 and the n+ region 111, or the electric potential of the n+ region 111 is set at an intermediate electric potential so as to obtain both of the effects. Which is advantageous depends on how to create an impurity profile that forms each region, and depends on damage during a manufacturing process. Therefore, a determination may be made by evaluation.

Figure 11:
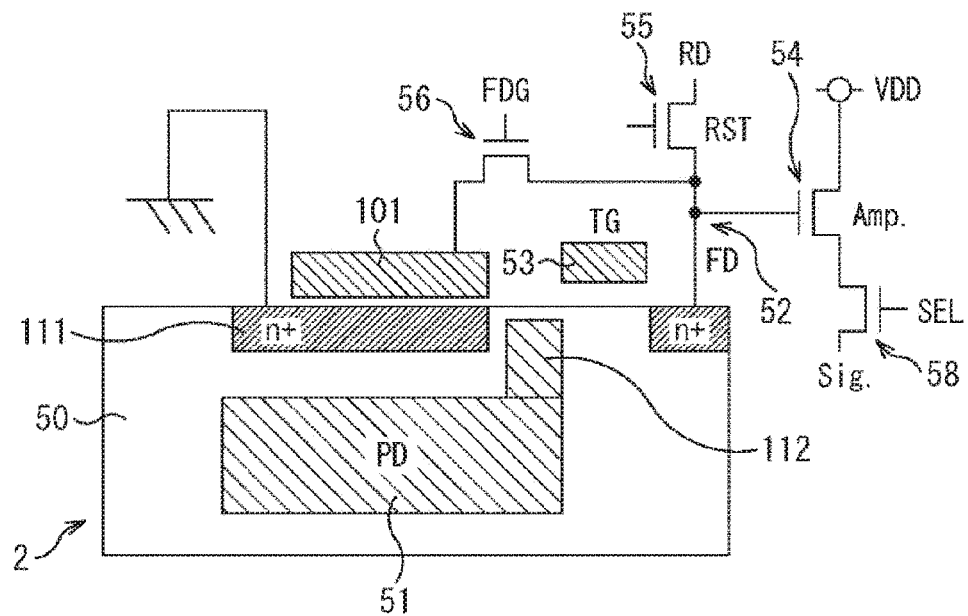
FIG. 11 is a cross-sectional view illustrating still a further configuration example of a pixel according to the present technology.

In addition, as shown in FIG. 11, the gate (FC 101) side may be connected to the FD 52 with the n+ region 111 side used as Vss. In the case of the example of FIG. 11, although the junction capacitance between the n+ region 111 and the pwell is not added, the electric potential on the PD 51 can be fixed. This eliminates the need for the operation of setting the electric potential of the gate during the light exposure time period.

Figures 12A, 12B, 12C:
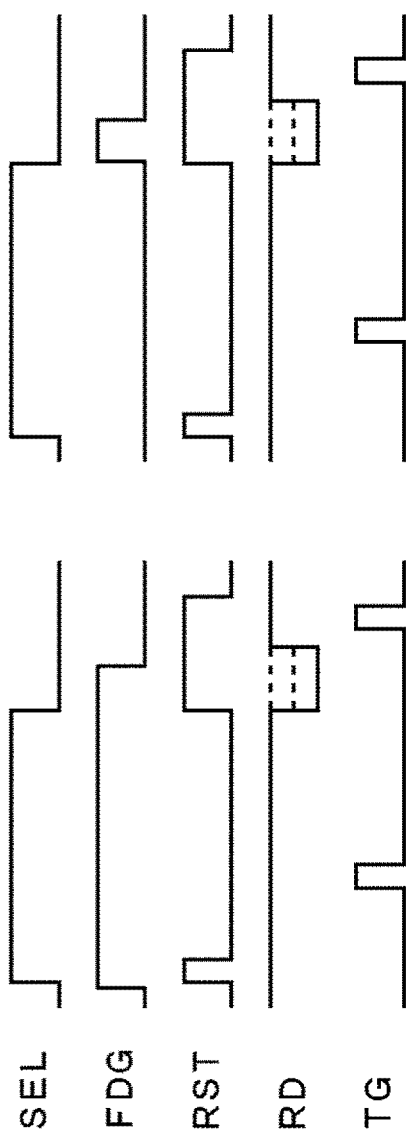
FIGS. 12A, 12B, and 12C are drawings illustrating an example of driving the pixels in the cases of FIGS. 8 to 11.

FIGS. 12A, 12B, and 12C are drawings illustrating an example of driving the pixels in the cases of FIGS. 8 to 11. FIG. 12A illustrates an example of driving the pixel in the case of the low conversion efficiency. FIG. 12B illustrates an example of driving the pixel in the case of the high conversion efficiency. FIG. 12C illustrates an example of driving the pixel in the case of electronic shuttering.

The example of driving in FIGS. 12A, 12B, and 12C are basically the same as the example of driving in FIGS. 3A, 3B, and 3C. However, although the RD is at the Low level in the example of FIGS. 3A, 3B, and 3C, dotted lines are drawn at the High level and at the Middle level in the example of FIGS. 12A, 12B, and 12C. This is because, since the n+ region 111 absorbs the dark current in the examples of FIGS. 8 to 11, the RD may be left at the High level. However, although the expansion of the depletion layer of the pewll region causes the dark current to increase, the voltage of the RD can be adjusted by the RD. Therefore, a determination can be made by evaluation.

Configuration Example of Pixel

Moreover, other configuration examples of the pixel according to the present technology will be described. An example of FIG. 13 shows a cross-sectional view of a PD unit in which a PD is deeply embedded, and in which a p-type MOS capacitance is mounted on the PD as a conversion-efficiency switching capacitance.

Figure 13:
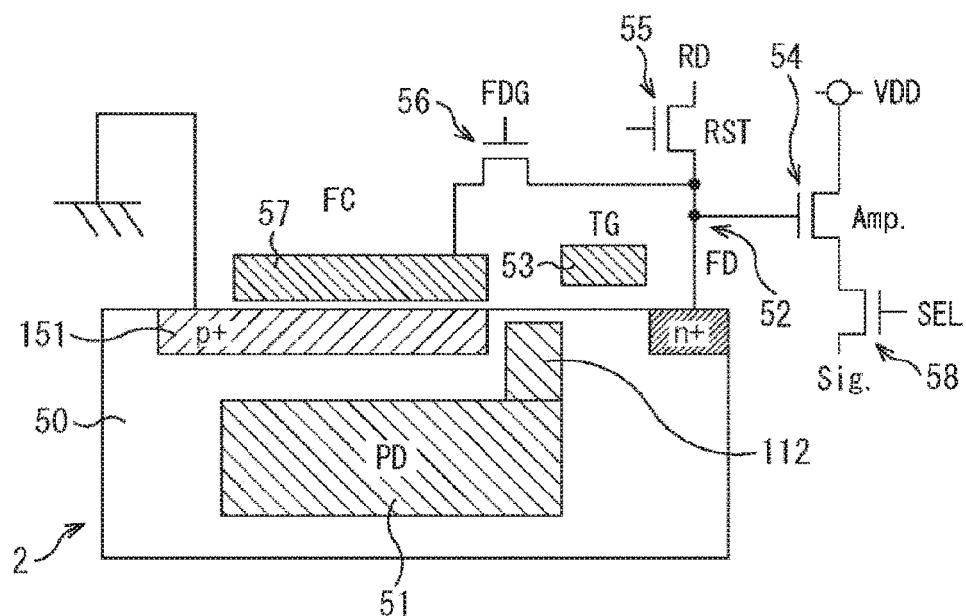
FIG. 13 is a cross-sectional view illustrating another configuration example of a pixel according to the present technology.

The cell configuration of the pixel 2 in FIG. 13 differs from that in the example of FIG. 8 in that the FC 101 that is a n-type MOS capacitance is replaced with the FC 57 that is a p-type MOS capacitance, and in that the N+ region 111 of the Tr-side Si/SIO2 interface of the PD unit 50 in FIG. 13 is replaced with a p-type region 151.

Figure 14:
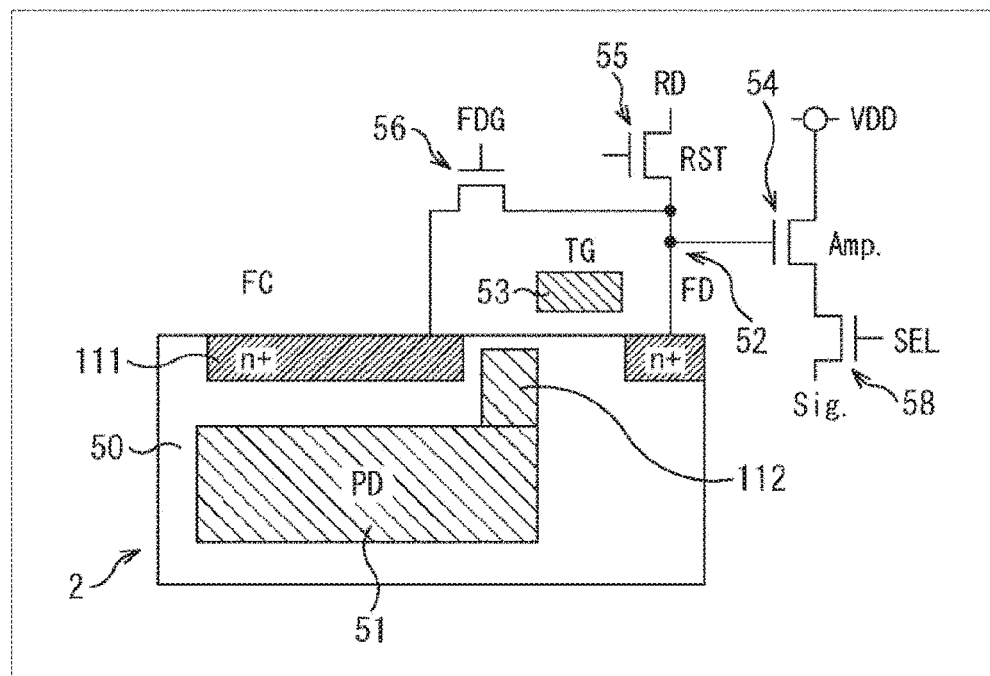
FIG. 14 is a cross-sectional view illustrating still another configuration example of a pixel according to the present technology.

FIG. 14 shows an example in which only the above-described junction capacitance (the n+ region 111) is used with reference to FIGS. 8 to 10. In other words, the example of FIG. 14 differs from the configuration of FIG. 8 only in that the FC 101 is excluded. In the case of the example of FIG. 14, by connecting the n+ region 111 to the FD 52 through the FDG 56, the junction capacitance between the n+ region 111 and the pwell is used as the FC.

Figure 15A:
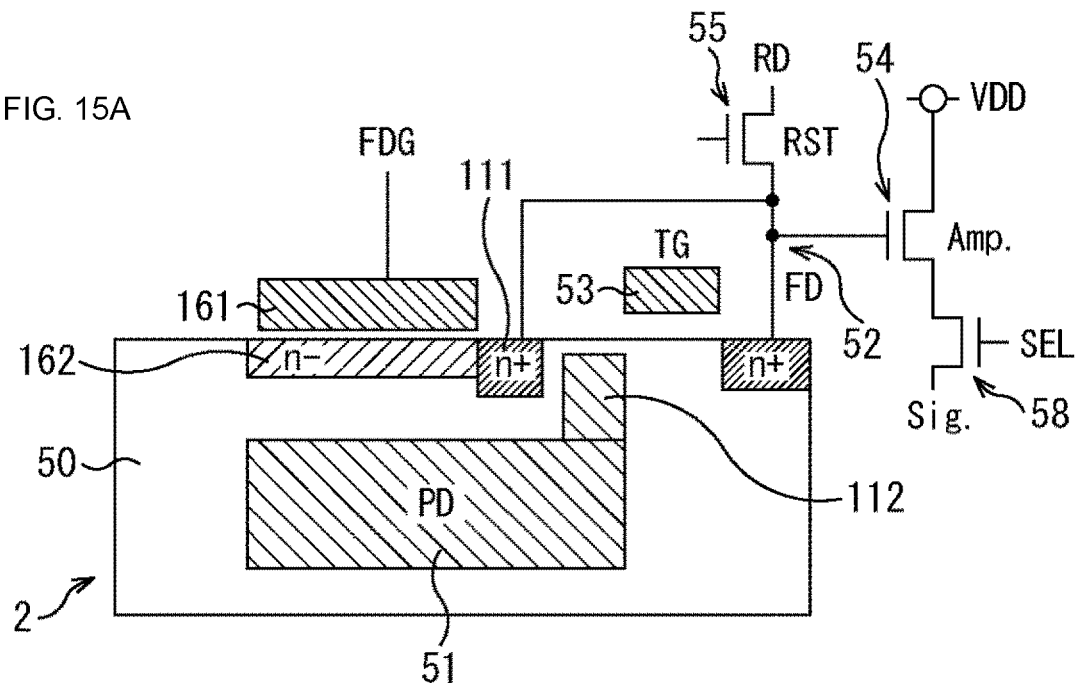
FIGS. 15A and 15B are cross-sectional views illustrating a further configuration example of a pixel according to the present technology.
Figure 15B:
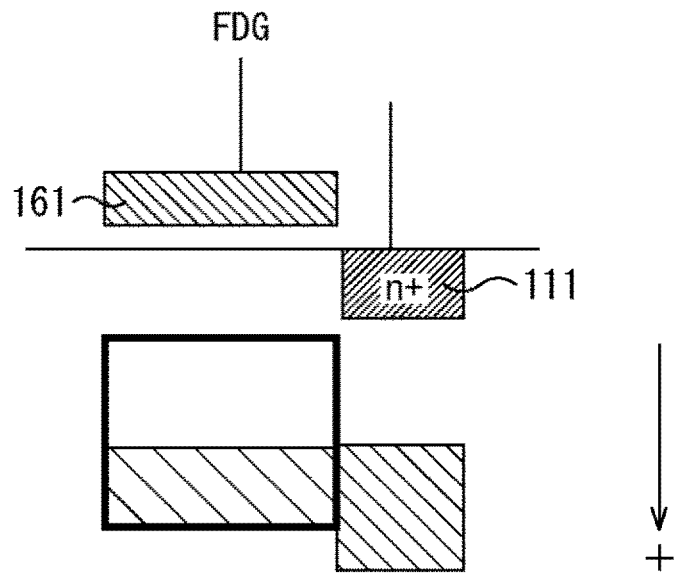

FIGS. 15A and 15B show an example in which a conversion-efficiency switching Tr and a gate of the MOS capacitance are used in combination. FIG. 15A is a cross-sectional view of the PD unit 50; and FIG. 15B is a potential diagram of the PD unit 50.

In the example of FIG. 15A, as an alternative to the FDG 56 connected to the n+ region 111, an FDG 161 is provided on an n− region 162 of the Si interface as the conversion-efficiency switching Tr and the gate of the MOS capacitance.

As shown in an electric potential (an electric potential that is positive downward) of a potential in FIG. 15B, in a case where the FDG 161 has a High electric potential, an electrical charge enters a part under the gate (FDG 161), and this part is added to the FD 52 as a capacitance (junction capacitance). In a case where the FDG 161 has a Low electric potential, an electrical charge does not enter the part under the gate (FDG 161), and therefore this part is not added to the FD 52 as the MOS capacitance.

Incidentally, as with the example of FIG. 8, FIGS. 13, 14, 15A and 15B each show the example in which the read part is pulled out to the interface by the implant. However, as with the example of FIG. 9 or 10, a combination with a T-shaped or I-shaped vertical Tr is also possible.

Figure 16A:
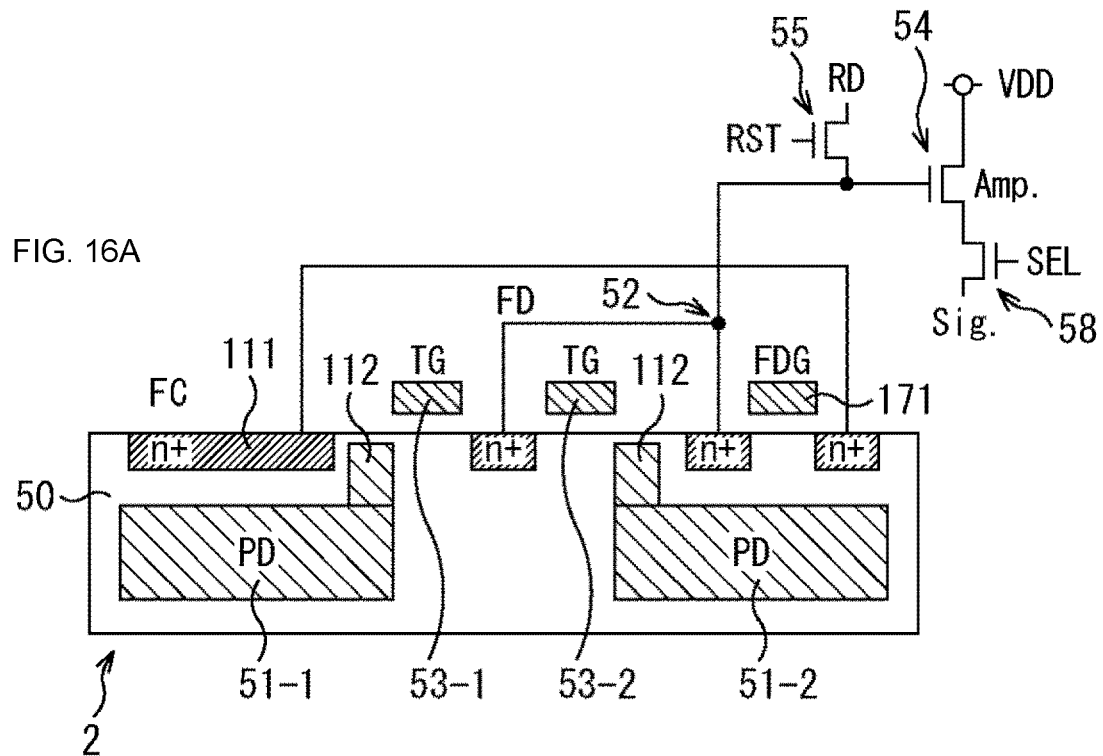
FIGS. 16A and 16B are cross-sectional views illustrating still a further configuration example of a pixel (in a case of a shared pixel) according to the present technology.
Figure 16B:
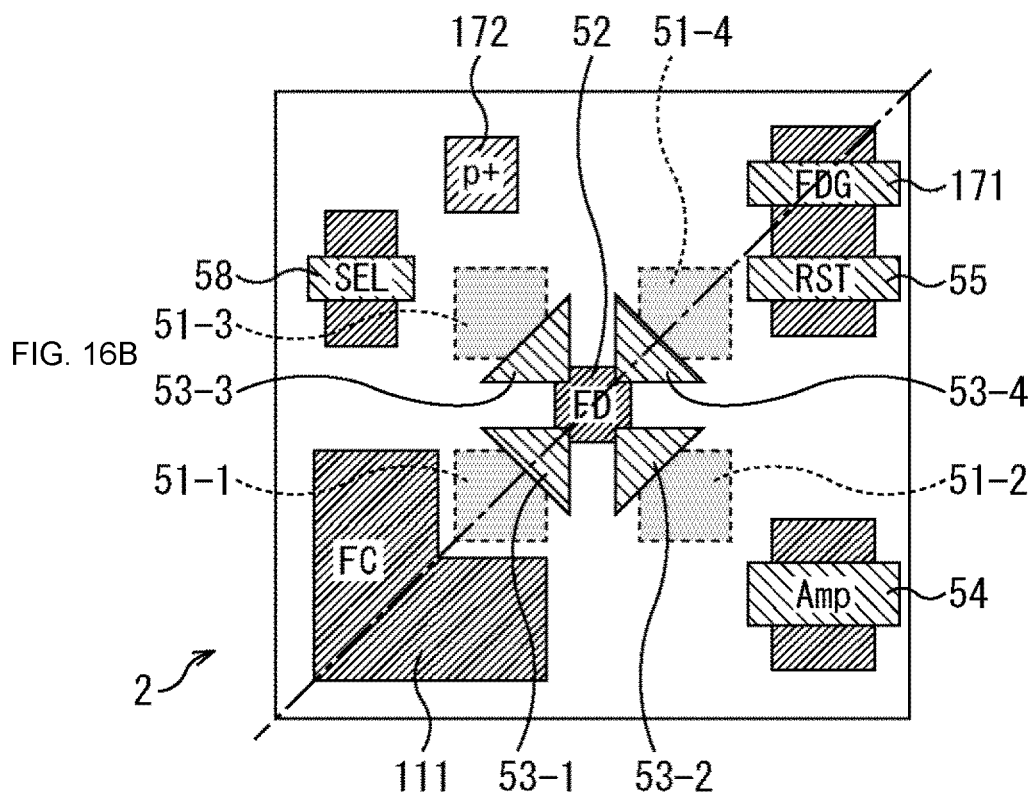
Figure 17:
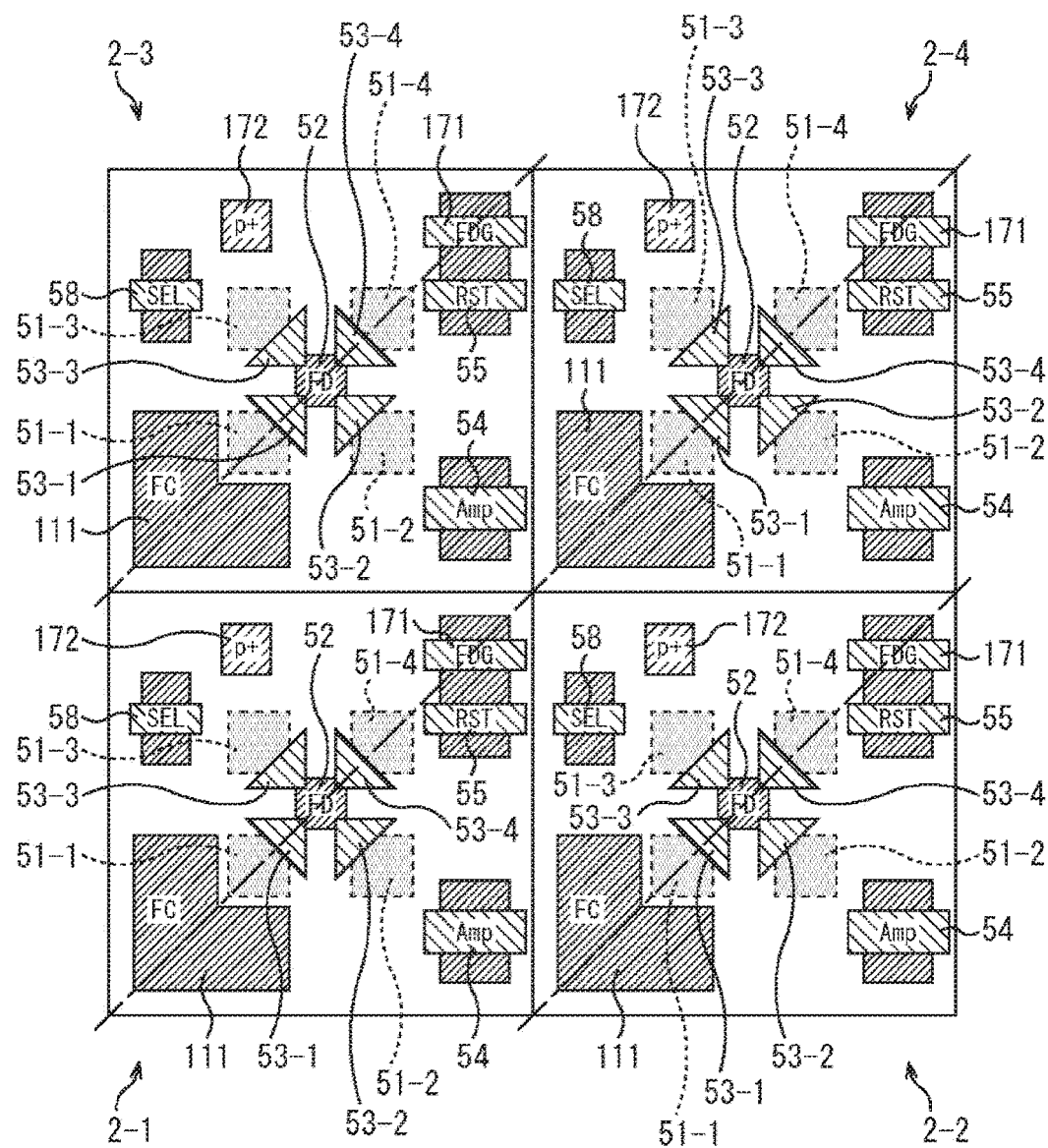
FIG. 17 is an array expansion plan of the shared pixel in FIGS. 16A and 16B.

FIGS. 16A, 16B, and 17 each show an example in which the configuration example of FIG. 14 is applied to a 2×2 shared pixel. FIG. 16A is a cross-sectional view of the PD unit 50; and FIG. 16B is a plan view of the 2×2 shared pixel. FIG. 17 is an array expansion plan of the shared pixel in FIG. 16B. In the case of the example of FIGS. 16A and 16B, it is not necessary to form a capacitance on each of the PDs 51. A capacitance has only to be formed on at least one PD 51 on a sharing basis. In that case, allocating and forming the other Trs and the other well contacts 172 on the other PDs 51 enables miniaturization with high area efficiency.

For example, in the example of FIGS. 16A and 16B, an N+ region 111 as the FC is formed on the PD 51-1. The Amp 54 that is one of the Trs is formed on the PD 51-2. The SEL 58, which is one of the Trs, and a well contact 172 are formed on the PD 51-3. A FDG 171, which is one of the Trs, and the RST 55 are formed on the PD 51-4.

It should be noted that considering the optical uniformity, in a case where arrangement in pixels of ½ is desired, it is preferable to perform the arrangement in pixels formed in checkered arrangement, for example, in G pixels formed in a Bayer array. In a case where arrangement in pixels of ¼ is desired, at the time of MOS capacitance, arrangement in pixels on the longer wavelength side causes a reflection component by poly to increase, which is advantageous from the viewpoint of sensitivity.

Figure 18A:
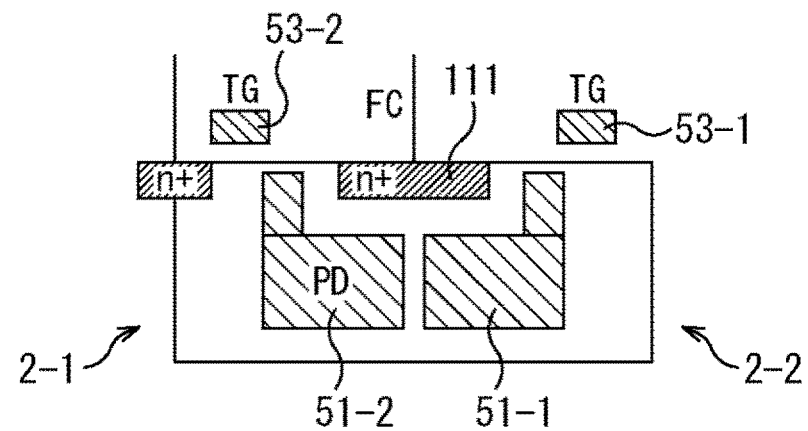
FIGS. 18A and 18B are cross-sectional views illustrating another configuration example of a pixel (in a case of a shared pixel) according to the present technology.
Figure 18B:
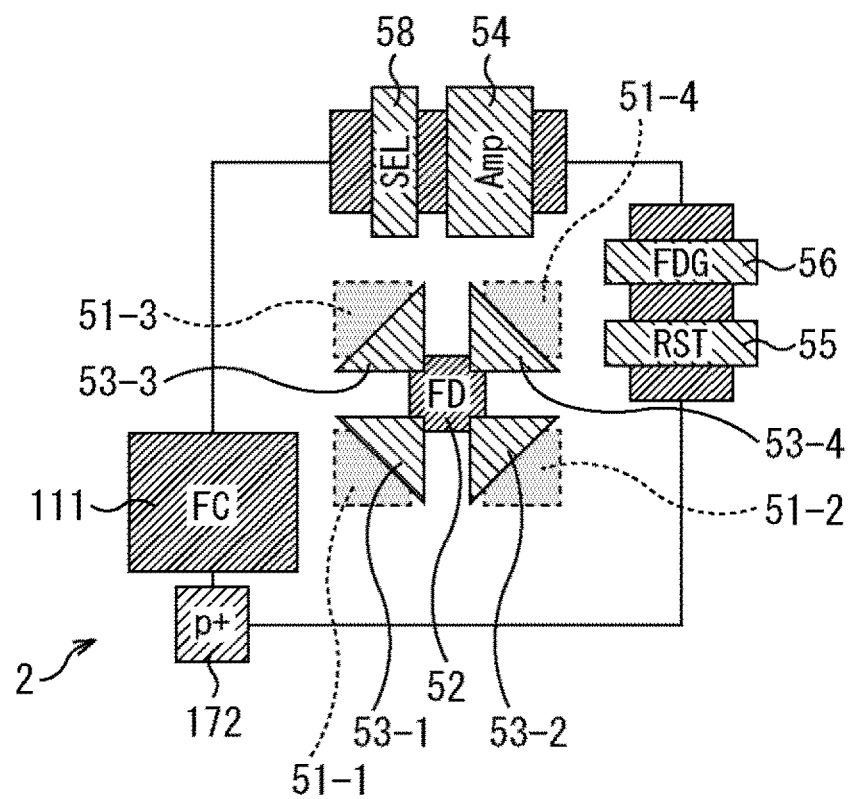
Figure 19:
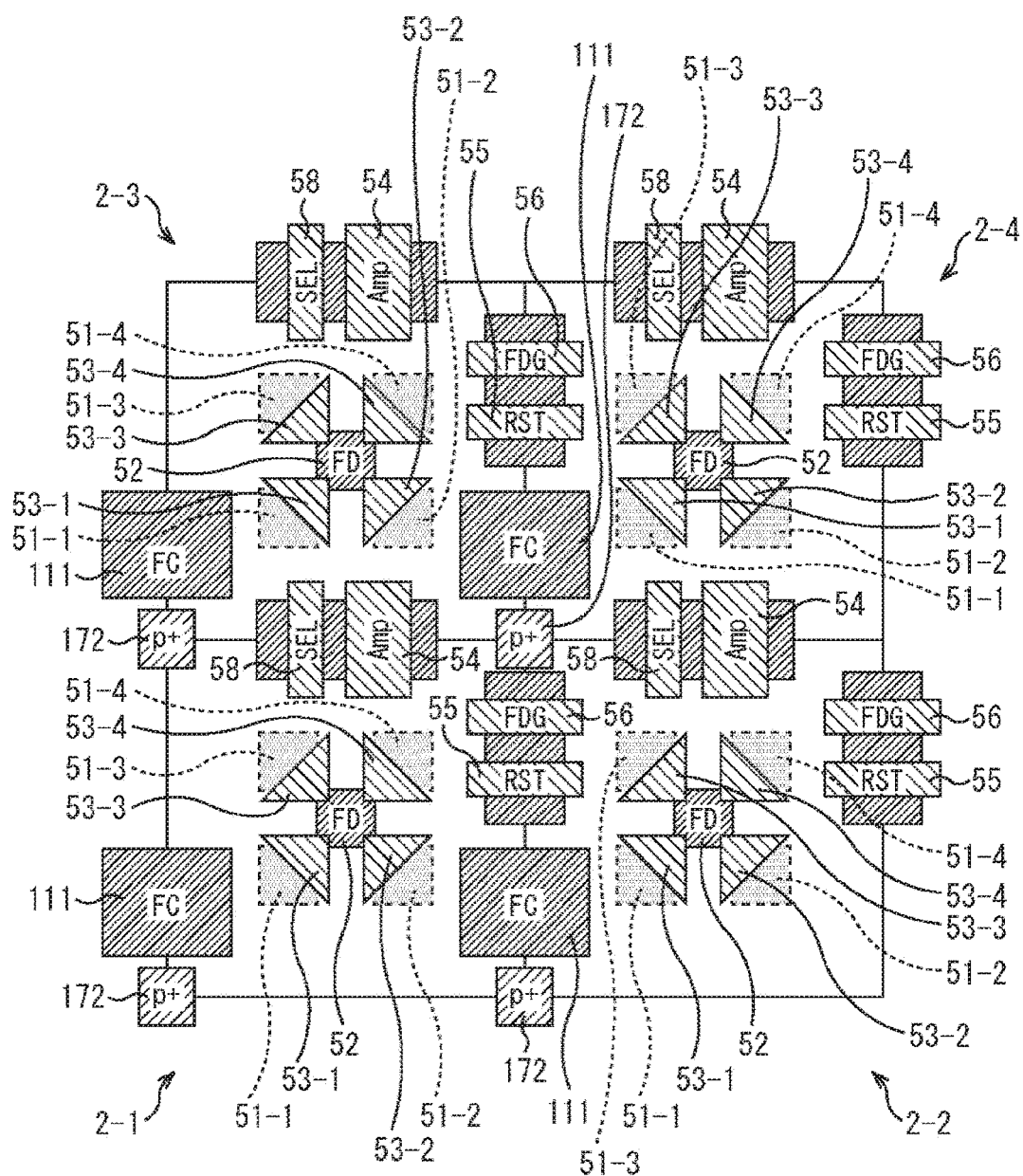
FIG. 19 is an array expansion plan of the shared pixel in FIGS. 18A and 18B.

FIGS. 18A, 18B, and 19 each show an example in which the junction capacitance in the example of FIG. 14 ranges over two PDs. FIG. 18A is a cross-sectional view focusing on the FC (the N+ region 111 as the FC) that extends over two adjacent shared pixels. FIG. 18B is a plan view illustrating a configuration example of one shared pixel. FIG. 19 is an array expansion plan of the shared pixel in FIG. 18B.

As shown in FIGS. 19A and 19B, a shared pixel 2-1, a shared pixel 2-2, a shared pixel 2-3 and a shared pixel 2-4 are arranged in order of, for example, the lower left, the lower right, the upper left and the upper right. As shown in FIG. 18B, four PDs 51-1 to 51-4, TGs 53-1 to 53-4 corresponding thereto, the FD 52, the SEL 58, the Amp 54, the FDG 56, the RST 55, the N+ region 111 as the FC, and the Well contact 172 are arranged in one shared pixel 2-2. Among them, the SEL 58 and the Amp 54 are arranged at the boundary with the pixel that is arranged on the shared pixel 2-2. Among them, the FDG 56 and the RST 55 are arranged at the boundary with the pixel that is arranged on the right side of the shared pixel 2-2. Among them, the N+ region 111 as the FC, and the Well contact 172, are arranged at the boundary with the shared pixel 2-1 that is arranged on the left side of the shared pixel 2-2. It should be noted that the Well contacts 172 are arranged in the four shared pixels.

In further detail, as shown in FIG. 18A, the N+ region 111 as the FC is formed on an interface above the PD 51-1 of the shared pixel 2-2, and above the PD 51-2 of the pixel 2-1 that is arranged on the left side thereof.

As described above, since the PD 51 is deeply embedded, the flexibility of a layout of elements on an interface on the upper side thereof increases. This also enables the arrangement in which the FC extends over the plurality of PDs 51.

Figure 21A:
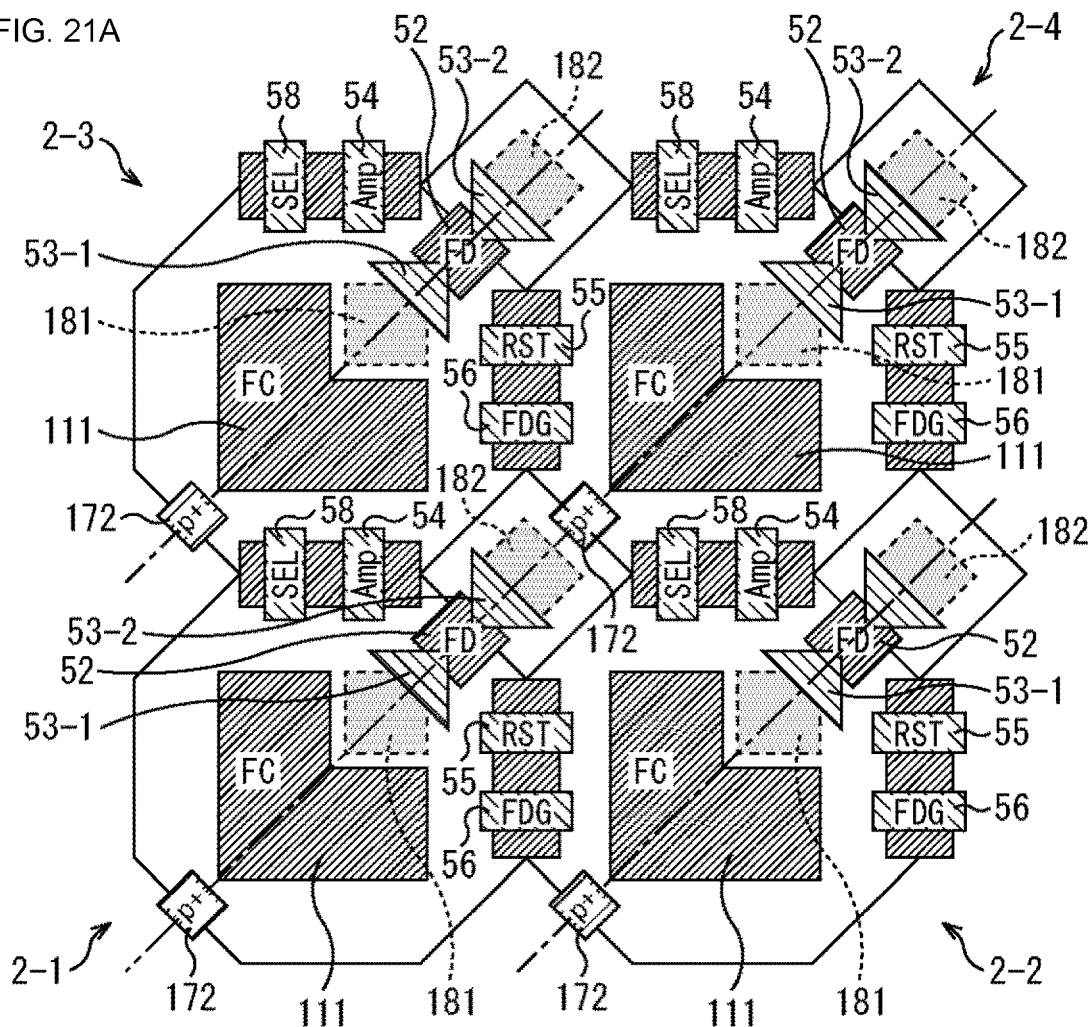
FIGS. 21A and 21B are array expansion plans of the shared pixel in FIGS. 20A, 20B, and 20C.
Figure 21B:
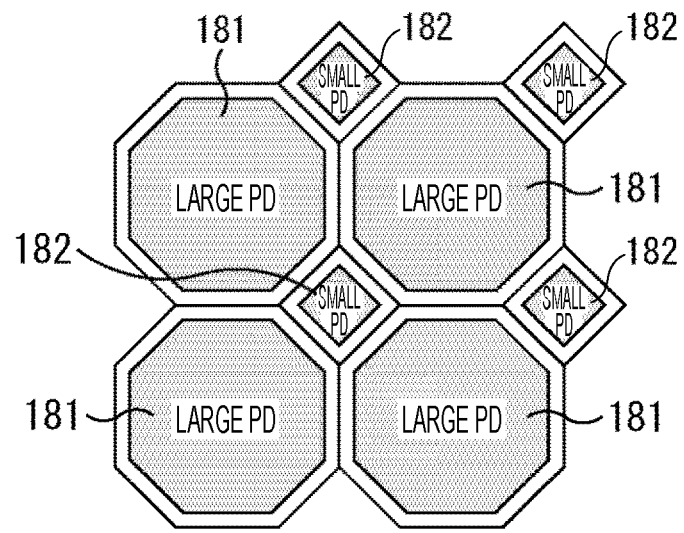

FIGS. 20A, 20B, 20C, 21A, and 21B each show an example in which a large-area (high sensitive) PD and a small-area (low sensitive) PD are combined in the configuration of the example of FIG. 14. FIG. 20A is a cross-sectional view illustrating a PD unit of a pixel having two PDs. FIG. 20B is a plan view viewing a PD surface. FIG. 20C is a surface view illustrating the PD unit. FIGS. 21A and 21B is an array expansion plan of the shared pixel in FIG. 20B.

A cell configuration of the pixel 2 in FIG. 20A differs from that in the example of FIG. 14 in that the PD 51 is replaced with a large PD 181 having a large area, and a small PD 182 having a small area is added, and that the TG 53 is replaced with a TG 53-1 and a TG 53-2 of respective PDs. The other parts of the configuration are shared by FIGS. 20A, 20B, and 20C and the example of FIG. 14. It should be noted that in the case of the example of FIGS. 20A, 20B, and 20C, the well contact 172 is formed on the boundaries with the adjacent right and left pixels, and in the case of the example of FIG. 14 as well, the well contact 172 is formed although not indicated.

In addition, as shown in FIGS. 21A and 21B, the shared pixel 2-1, the shared pixel 2-2, the shared pixel 2-3 and the shared pixel 2-4 are arranged in order of, for example, the lower left, the lower right, the upper left and the upper right. As shown in FIG. 20B, the Large PD 181 and the small PD 182, TGs 53-1 and 53-2 corresponding thereto, the FD 52, the SEL 58, the Amp 54, the FDG 56, the RST 55, the N+ region 111 as the FC, and the Well contact 172 are arranged in one shared pixel 2-2. Among them, the N+ region 111 as the FC is arranged on an interface above the large PD 181. Among them, the SEL 58 and the Amp 54, on the shared pixel 2-2, among them, the SEL 58 and the Amp 54 are arranged at the boundary with the pixel that is arranged on the shared pixel 2-2. Among them, the FDG 56 and the RST 55 are arranged at the boundary with the pixel that is arranged on the right side of the shared pixel 2-2. Incidentally, the pixel in FIGS. 21A and 21B is formed to have an octagonal shape from which the small PD 182 protrudes toward the upper right, and the Well contact 172 is arranged on the lower right side of the octagonal shape. In other words, the Well contact 172 is arranged at the boundary with a protruding part formed by the protrusion of the small PD of the shared pixel that is arranged on the lower left of the shared pixel 2-2.

It should be noted that in the examples of FIGS. 20A, 20B, 20C, 21A, and 21B, the capacitance (FC) and the Tr may be replaced with each other.

In addition, as shown in FIG. 20B, when a layout is viewed on the PD surface, the layout is backside-illumination type, and the light-focusing center of an on-chip lens is aligned with a color filter, which is not illustrated, around this PD. In this case, in a case where the large-area (high sensitive) PD is read, it is preferable to combine the reading with high sensitive reading in FIG. 12B; and in a case where the small-area (low sensitive) PD is read, combining the reading with low sensitive reading in FIG. 12A is effective.

Figure 22:
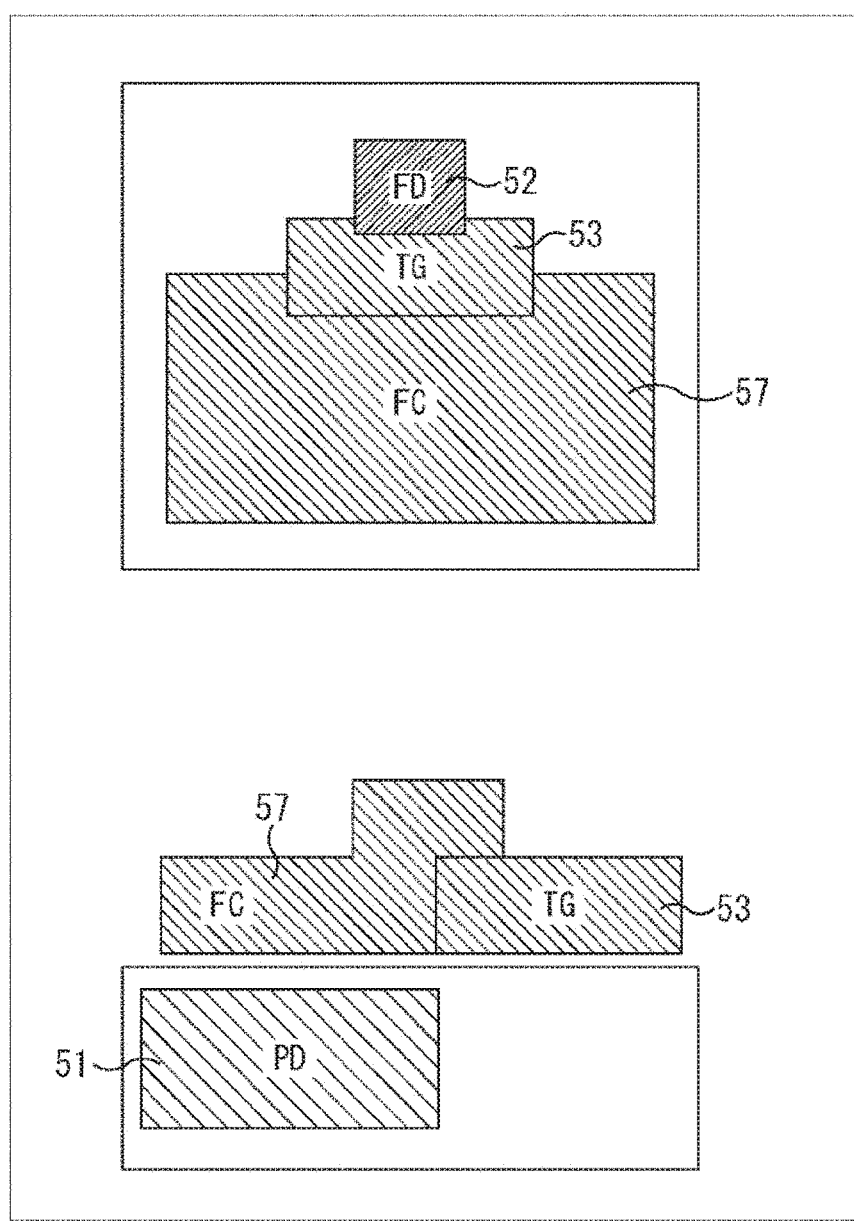
FIG. 22 is a drawing illustrating a position at which a gate is formed.

In addition, in a case where a p-type MOS capacitance as shown in FIG. 2 or the like is used, as described above with reference to FIG. 4, using a lower gate electric potential results in a higher linearity. However, the gate of the FC is used with the gate connected to the FD. Therefore, when an electric potential of the gate of the FC is decreased by decreasing an electric potential of the RD, an electric potential of the FD also decreases, which causes a transfer electric field to the PD and the FD to decrease. Consequently, complete transfer becomes difficult. Accordingly, as shown in FIG. 22, the TG 53 and the gate of the FC 57 are adjacently formed. As the result, using such a layout that a gate (FD) electric potential of the FC is increased in response to coupling at the time of Tgon is advantageous for transfer. When the gate of the FC and the Tr gate are separately formed, causing the FC and the TG to overlap each other is effective from the viewpoints of the capacitance and the transfer voltage.

In addition, assuming a case where the linearity has been worsened, it is preferable that the linearity can be corrected beforehand by signal processing in a stage that is more subsequent than signal lines of the pixel array. When the image sensor is measured, recording linearity information on a solid basis enables to perform the correction more easily, for example, to correct the bend of the low light amount part shown in FIG. 5.

Figure 23A:
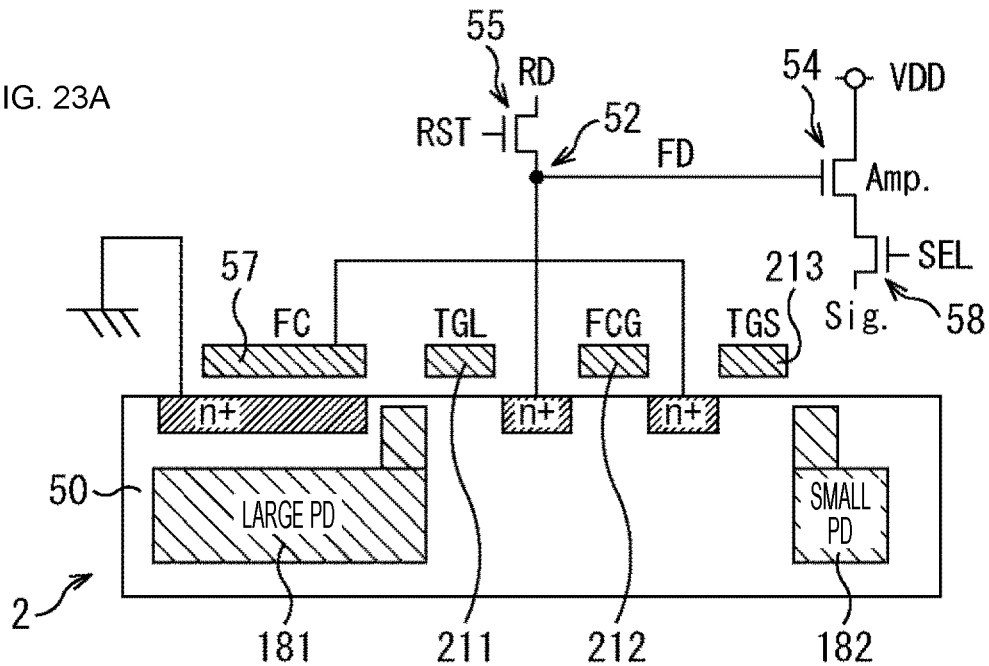
FIGS. 23A and 23B are cross-sectional views illustrating a further configuration example of a pixel (in a case of a configuration including a large-area PD and a small-area PD) according to the present technology.
Figure 23B:
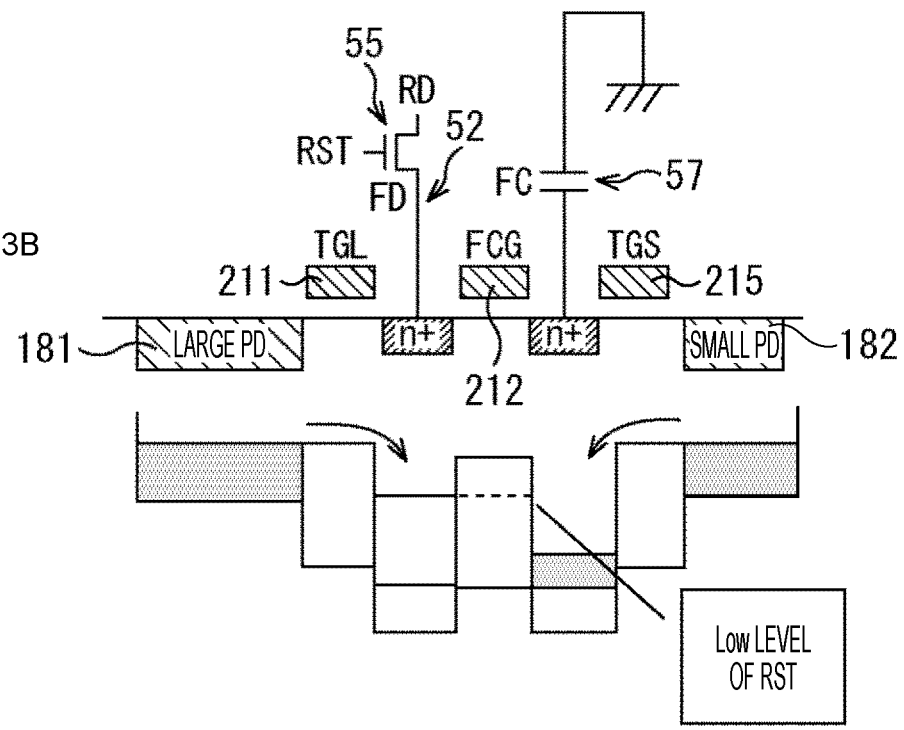

FIGS. 23A and 23B illustrates an example in which a large PD is combined with a MOS capacitance on the small PD side of the small PD.

In an example of FIG. 23A, an electrical charge that overflows from the small PD 182 during a light exposure time period is also treated as a signal. Therefore, the example of FIG. 23A differs from the example of FIG. 20A in that the FC 57 to which the electrical charge overflows from the small PD 182, and the FD 52 to which an electrical charge overflows from the large PD 181, are separated as a Floating Capacitor gate (FCG) 212.

As the result, as shown in FIG. 23B, the electrical charge overflowed from the high-luminance small PD 182 is accumulated in the FC 57, which enables the operation in which a range on the higher luminance side is extended.

Figure 24A:
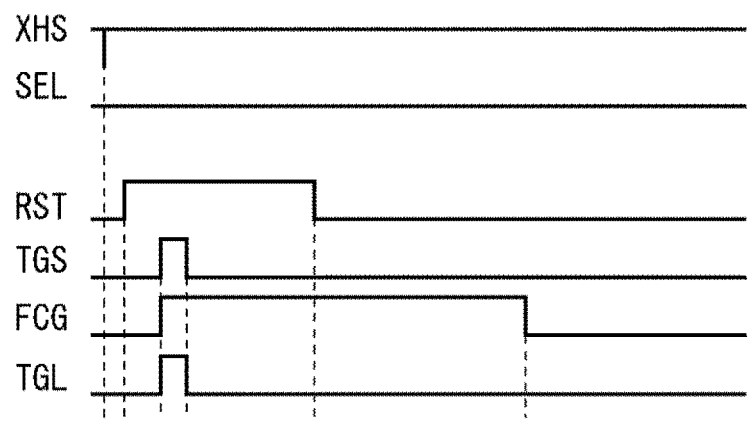
FIGS. 24A and 24B are drawings illustrating an example of driving the pixel in the case of FIGS. 23A and 23B.
Figure 24B:
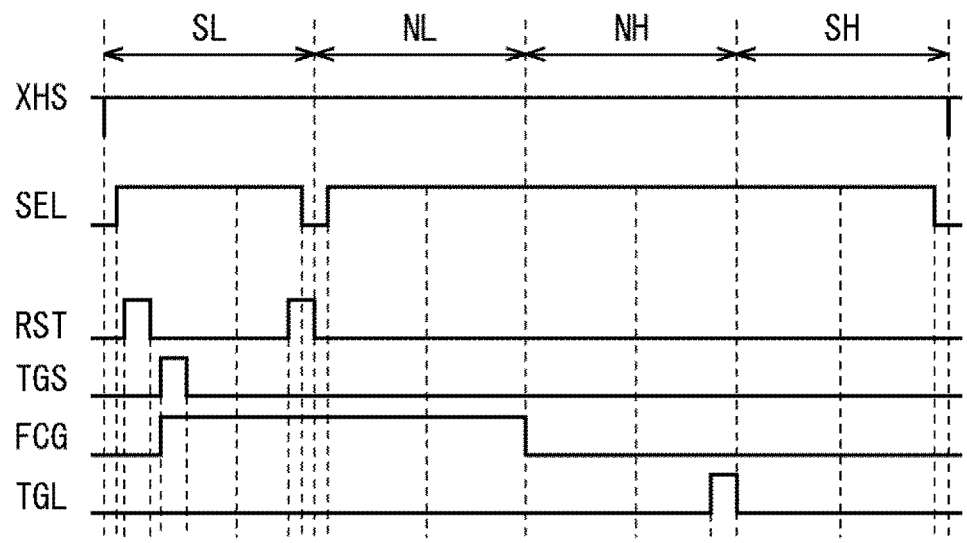
Figure 25A:
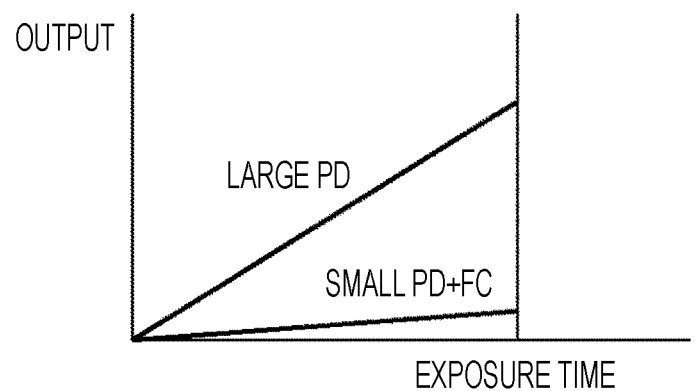
FIGS. 25A and 25B are drawings illustrating a relationship between the output and the exposure time.
Figure 25B:
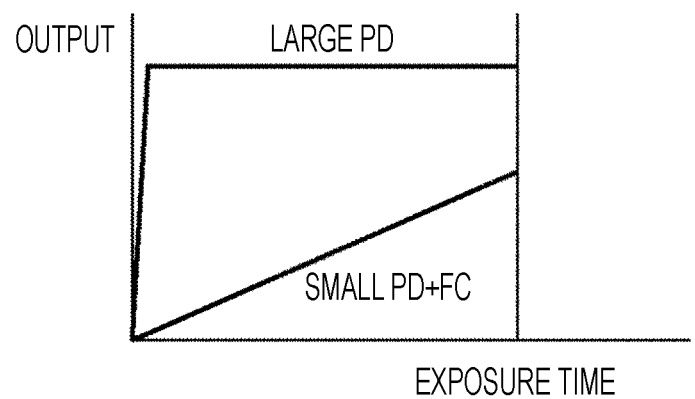

FIG. 24A is a timing chart at the time of electronic shuttering in the example of FIG. 23A; and FIG. 24B is a timing chart at the time of reading in the example of FIG. 23A. At the time of electronic shuttering, the RST 55, a TGS 213, a TGL 211 and the FCG 212 are switched on/off with the SEL 58 kept switched off, the large PD 181, the small PD 182, the FD 52 and the FC 57 are reset, and exposure to light is started. In that case, as shown in a potential diagram of FIG. 23B, the large PD 181 is saturated in a high-luminance region, and a photoelectrically converted electrical charge exceeds Low levels of the TGL 211 and the RST 55, and is then discharged to the RD. The FC 57 exists for the purpose of using a signal on the small PD 182 side, and therefore a potential is formed in such a manner that saturated components of the large PD 181 do not enter. The signal charge that has been photoelectrically converted on the small PD 182 side is accumulated in a small PD+FC capacitance. Therefore, as shown in FIG. 25A and FIG. 25B, even in a case of such a high-luminance region that the large PD 181 is saturated in a short time, the small PD+FC is not saturated.

As shown in FIG. 24B, after the lapse of the exposure time, a corresponding pixel is selected by the SEL 58. The FD 52 is reset to an RD level by the RST 55. Subsequently, the FCG 212 is switched on, the FC 57 is connected to the FD 52, and the capacitance of the FD increases. Therefore, the conversion efficiency becomes low. Next, the TGS 213 is switched on/off, and an electrical charge of the small PD 182 is read by the FD 52. Here, a signal level (SL phase) is read. Next, the RST 55 is switched on to reset the FD 52 to the RD level. When the RST 55 is switched off, by setting the SEL 58 at a Low level, an FD electric potential state that is the same as that at the time of electronic shuttering is achieved. Subsequently, the SEL 58 is switched on again, and a reset level (NL phase) is read. By subtracting an NL level from an SL level, noises such as Vth dispersion are removed.

Next, the FCG 212 is switched off to isolate the FD 52 from the FC 57. As the result, the capacitance of the FD 52 decreases, and therefore the conversion efficiency becomes high. Here, an example in which the FD 52 is not reset again will be described. First of all, a reset level (NH phase) at the time of high conversion efficiency is read. Subsequently, the TGL 211 is switched on/off, an electrical charge of the large PD 181 is transferred to the FD 52, and a signal level (SH phase) is read. Noises are removed by CDS in the NH phase and the SH phase. On the high conversion efficiency side, driving allows the CDS operation that is also capable of removing reset noises.

Figure 26:
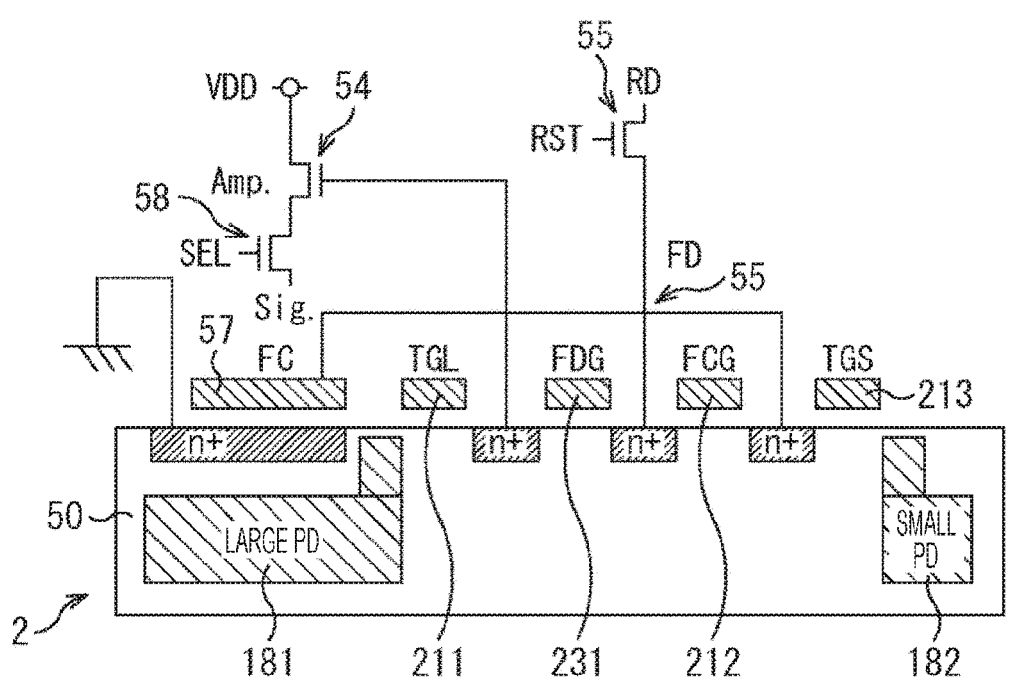
FIG. 26 is a cross-sectional view illustrating still a further configuration example of a pixel (in a case of a configuration including a large-area PD and a small-area PD) according to the present technology.
Figure 27A:
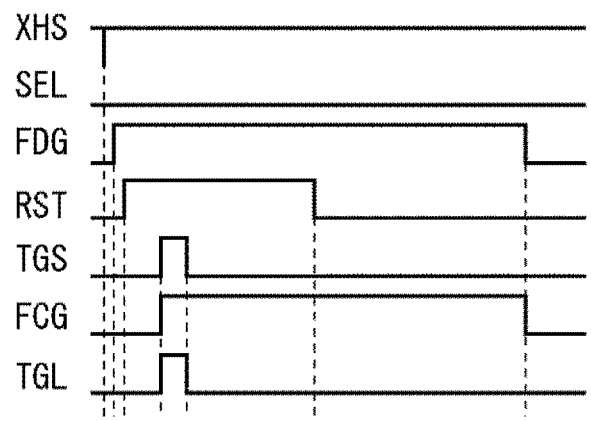
FIGS. 27A and 27B are drawings illustrating an example of driving the pixel in the case of FIG. 26.
Figure 27B:
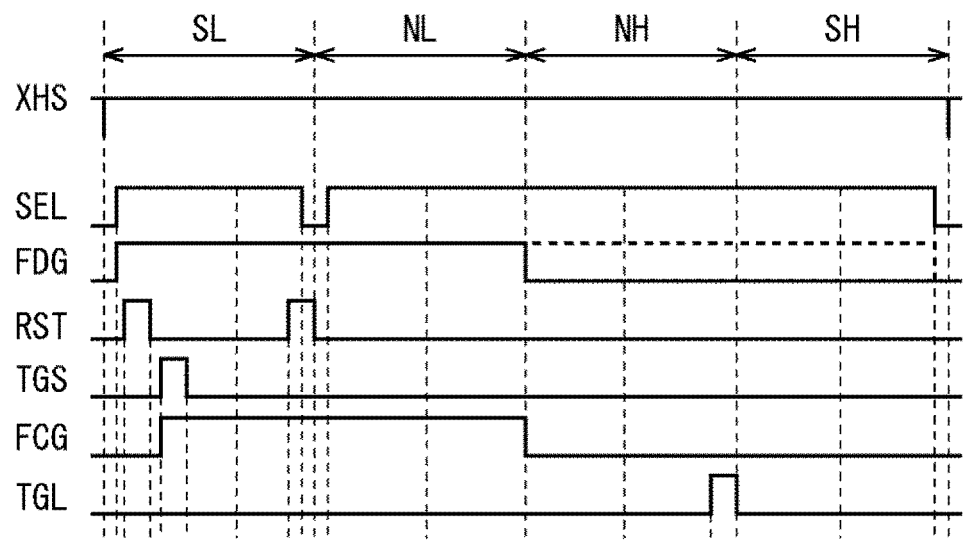

FIG. 26 illustrates an example in which an FDG of a conversion-efficiency switching Tr is added to the example of FIG. 23A. FIG. 27A is a timing chart of electronic shuttering in FIG. 26; and FIG. 27B is a timing chart at the time of reading.

In the example of FIG. 23A, elements that connect to the FD 52 at the time of high conversion efficiency are the Amp 54, and three diffusion regions that are the TGL 211, the FCG 212 and the RST 55, whereas in the configuration in FIG. 26, elements that connect to the FD 52 at the time of high conversion efficiency are the Amp 54, and two diffusion regions that are the TGL 211 and FDG 231. In other words, in the example of FIG. 26, there is one region because the diffusion region is shared by the TGL 211 and the FDG 231. However, the number of regions is two because the diffusion region is used for different elements. Therefore, the capacitance of the FD at the time of high conversion efficiency can be further reduced. In addition, at the time of low conversion efficiency, the capacitance of the added FDG 231 is added to the FD 52, and therefore the conversion efficiency can be further decreased. A large difference between high and low can be provided, and therefore it is possible to cope with higher D-range.

Figure 28A:
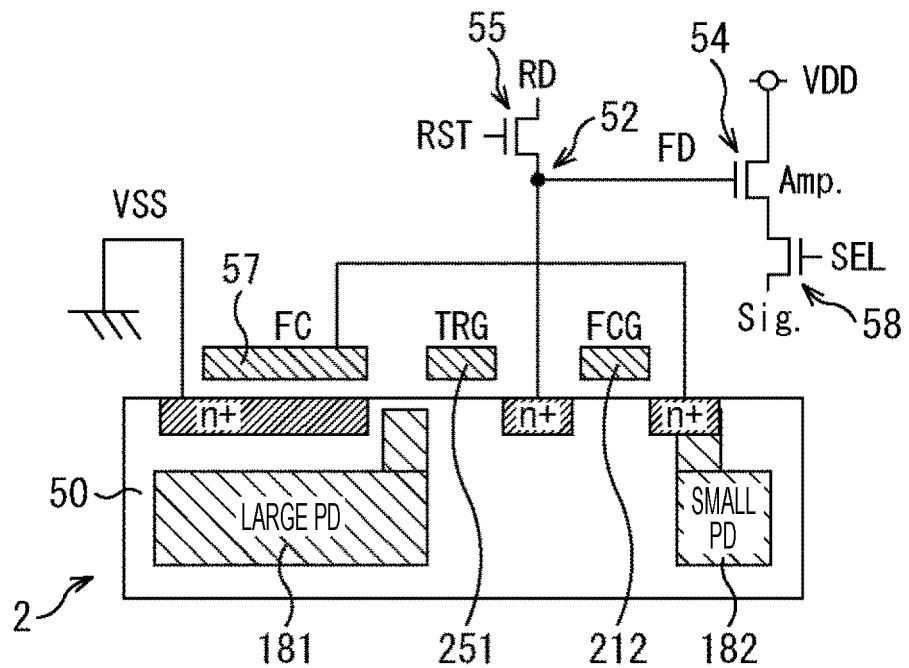
FIGS. 28A and 28B are drawings illustrating another configuration example of a pixel (in a case of a configuration including a large-area PD and a small-area PD), and an example of driving the pixel, according to the present technology.
Figure 28B:
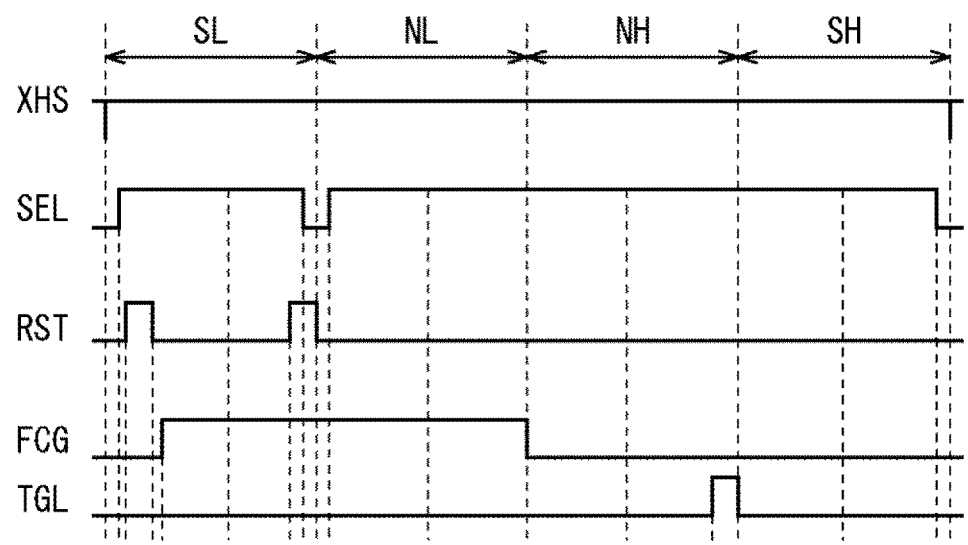

FIG. 28A illustrates an example in which the TGS is excluded from the example of FIG. 26. FIG. 28B is a timing chart illustrating the operation thereof.

In the example of FIG. 28A, points of difference are that the TGS 213 is excluded, and that the TGL 211 is replaced with the TRG 251. The other parts of the configuration are the same. By the configuration made in this manner, since the small PD 182 on the high-luminance side is highly resistant to offset noises, the PD and the capacitance FC are directly connected to omit the TGS 213, thereby enabling to cope with further miniaturization.

Figure 29A:
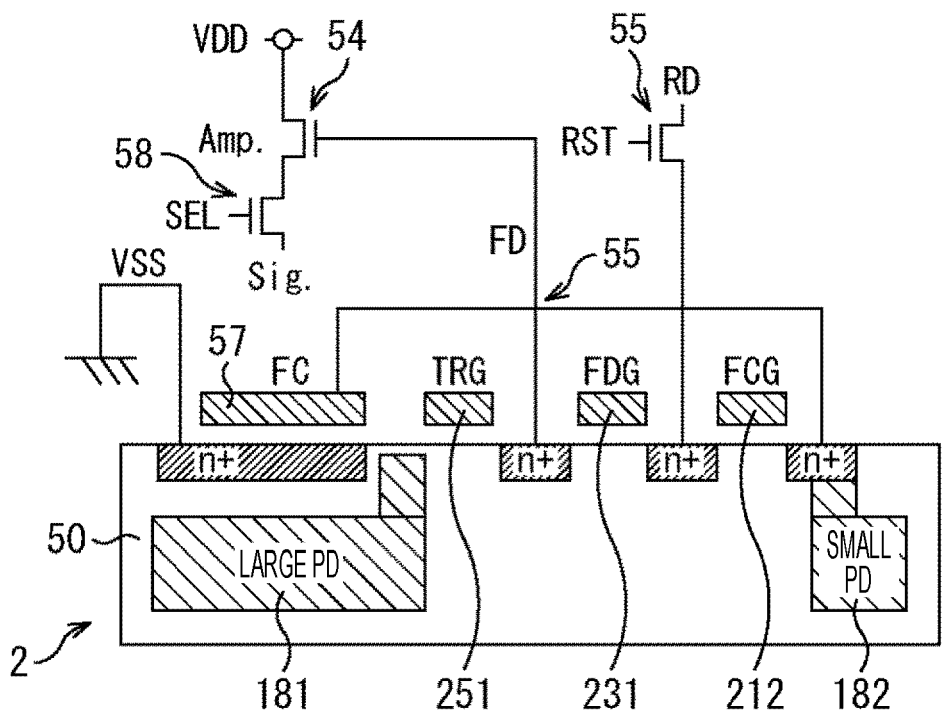
FIGS. 29A and 29B are drawings illustrating still another configuration example of a pixel (in a case of a configuration including a large-area PD and a small-area PD), and an example of driving the pixel, according to the present technology.
Figure 29B:
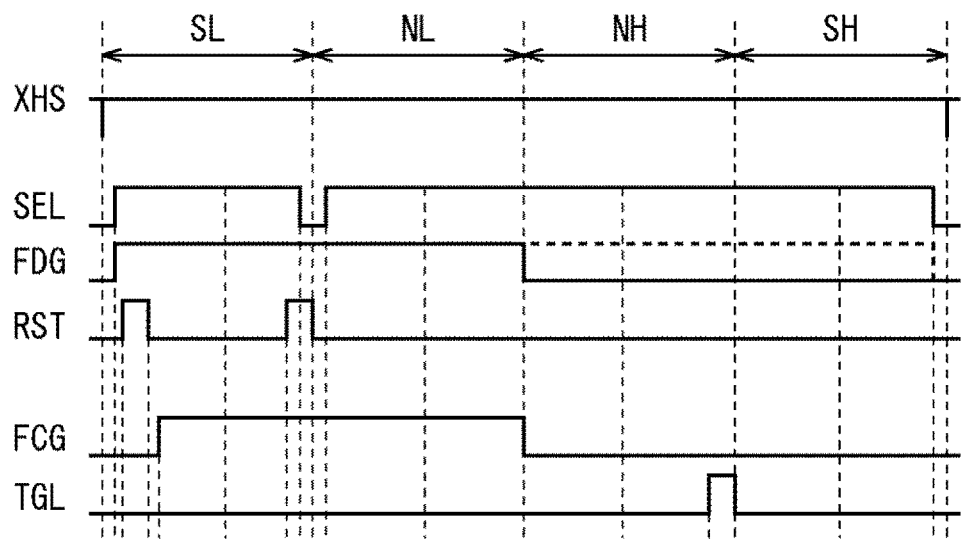

FIG. 29A illustrates an example in which the FDG is added to the example of FIG. 28A. FIG. 29B is a timing chart illustrating the operation thereof.

Figure 30A:
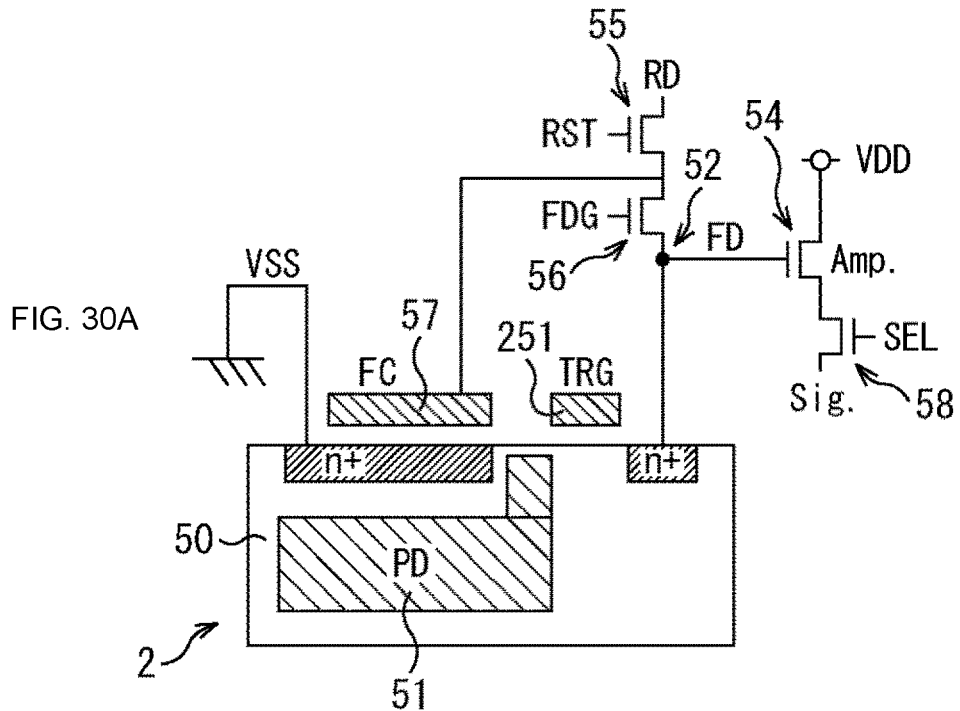
FIGS. 30A and 30B are drawings illustrating a further configuration example of a pixel according to the present technology.
Figure 30B:
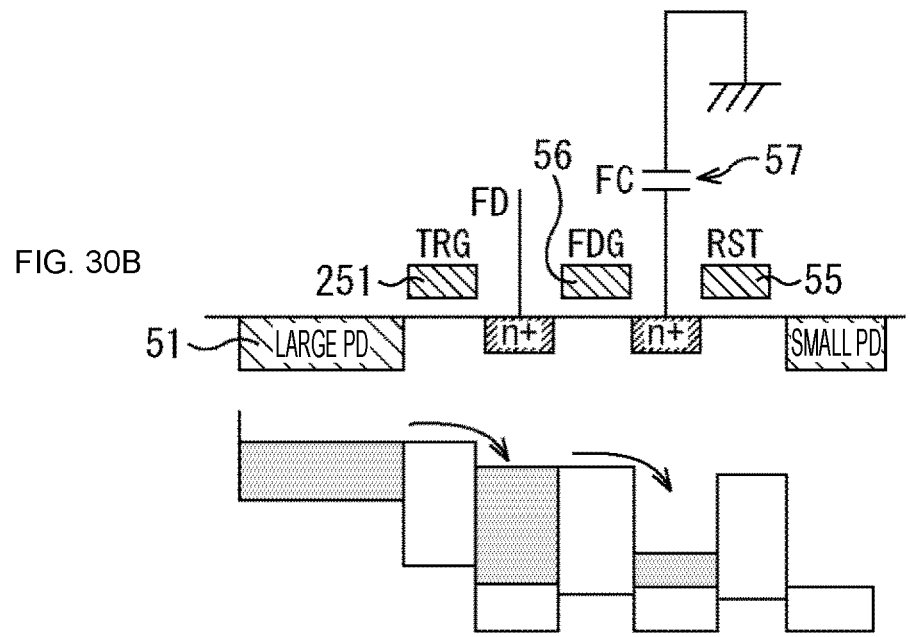

FIG. 30A illustrates an example in which a dynamic range is extended without using a small PD. FIG. 30B is a potential diagram thereof.

As shown in FIG. 30B, at the time of a high-luminance signal, a photoelectrically converted electrical charge passes beyond the TRG 251 from the PD 51, and overflows in the FD 52. The electrical charge further passes beyond the FDG 56, and overflows in the FC 57.

Figure 31A:
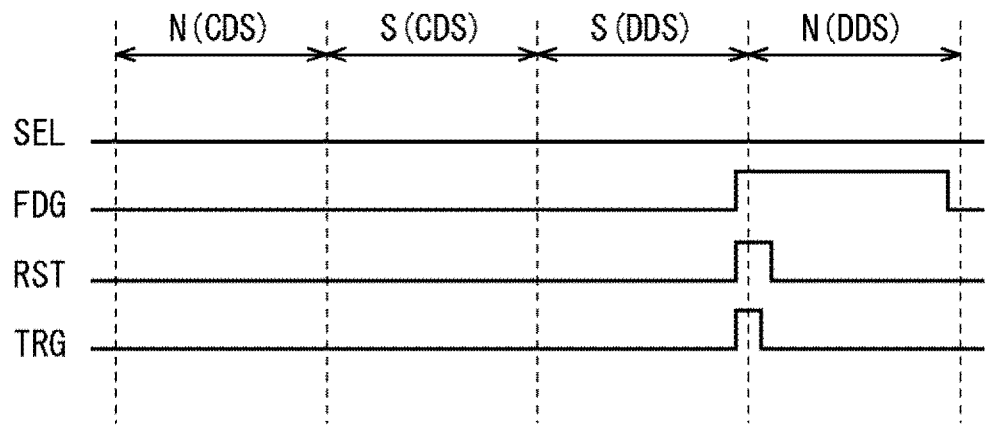
FIGS. 31A and 31B are drawings illustrating an example of driving the pixel in the case of FIGS. 30A and 30B.
Figure 31B:
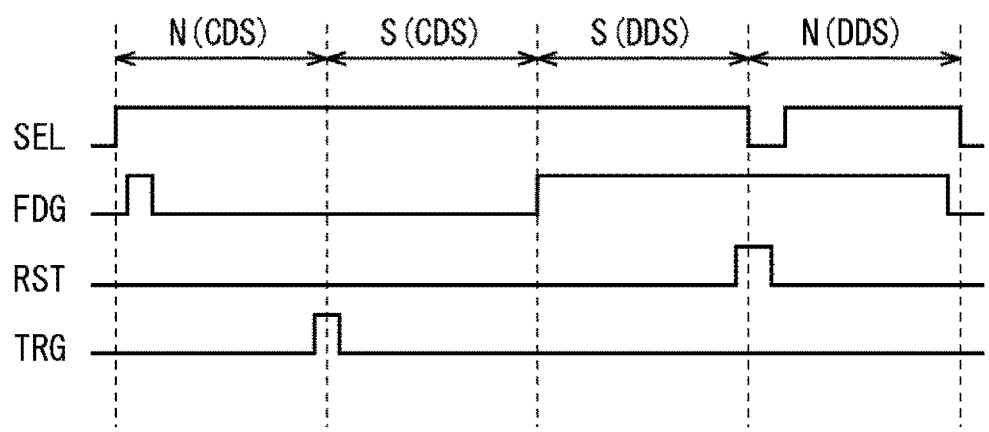

FIG. 31A is a timing chart at the time of electronic shuttering in the example of FIG. 30A; and FIG. 31B is a timing chart at the time of reading in the example of FIG. 20A. As shown in the timing chart of FIG. 31B, at the time of reading, by switching on/off the FDG 56, the FD 52 is reset to a level of the electrical charge that has overflowed to the FD 52+the FC 57, and a high conversion efficiency reset level N(CDS) is read. Subsequently, by switching on/off the TRG 251, a photoelectrically converted signal charge accumulated in the PD 51 is transferred to the FD 52, and a signal level S(CDS) is read. After that, the FDG 56 is switched on, the FD 52 is connected to the FC 57, and the capacitance of the FD 52 is increased, thereby switching to a low conversion efficiency.

Here, a signal level S(CDS) on the low conversion efficiency side is read. The reason why the SEL 58 is switched off at the time of resetting is because alignment with the electric potential at the time of electronic shuttering is required. Noises including reset noises can be removed by CDS on the high conversion efficiency side, which is the same as the example of FIGS. 23A and 23B.

Incidentally, the example in which the gate is connected to the VDD has been shown in FIGS. 8 to 10 described above. However, in a case where n+ is sufficiently dense, the elongation of the depletion layer is little, and fluctuations in capacitance are small. Therefore, the connection to the VSS is allowed. Similarly, the n+ diffusion layer in FIG. 11 may also be connected to the VSS.

In the above explanation, as the circuit configuration and the operation, the example of using one combination of the capacitance configuration, the TG shape and the PD shape has been explained. However, other combinations may be used. In addition, the driving method is merely an example.

As described above, a large capacitance can be obtained by the small area, and consequently the area efficiency of the Tr element side Si interface increases. When being used for a low sensitive pixel for switching the conversion efficiency, a ratio between the high conversion efficiency and the low conversion efficiency can be increased. This enables to perform a wide D-range image pickup in which SN is satisfactory at low luminance, and overexposure does not occur at high luminance.

It should be noted that although, in the above explanation, the example of the backside-illumination solid-state image pickup device has been explained, the present technology can also be applied to a surface-illumination solid-state image pickup device.

In addition, in the above explanation, the capacitance for switching the conversion efficiency has been mainly explained. However, even in a case where a capacitance is used not for switching a conversion efficiency, but for other uses, the present technology can be applied.

2. Second Embodiment (Example of Using Image Sensor)

Figure 32:
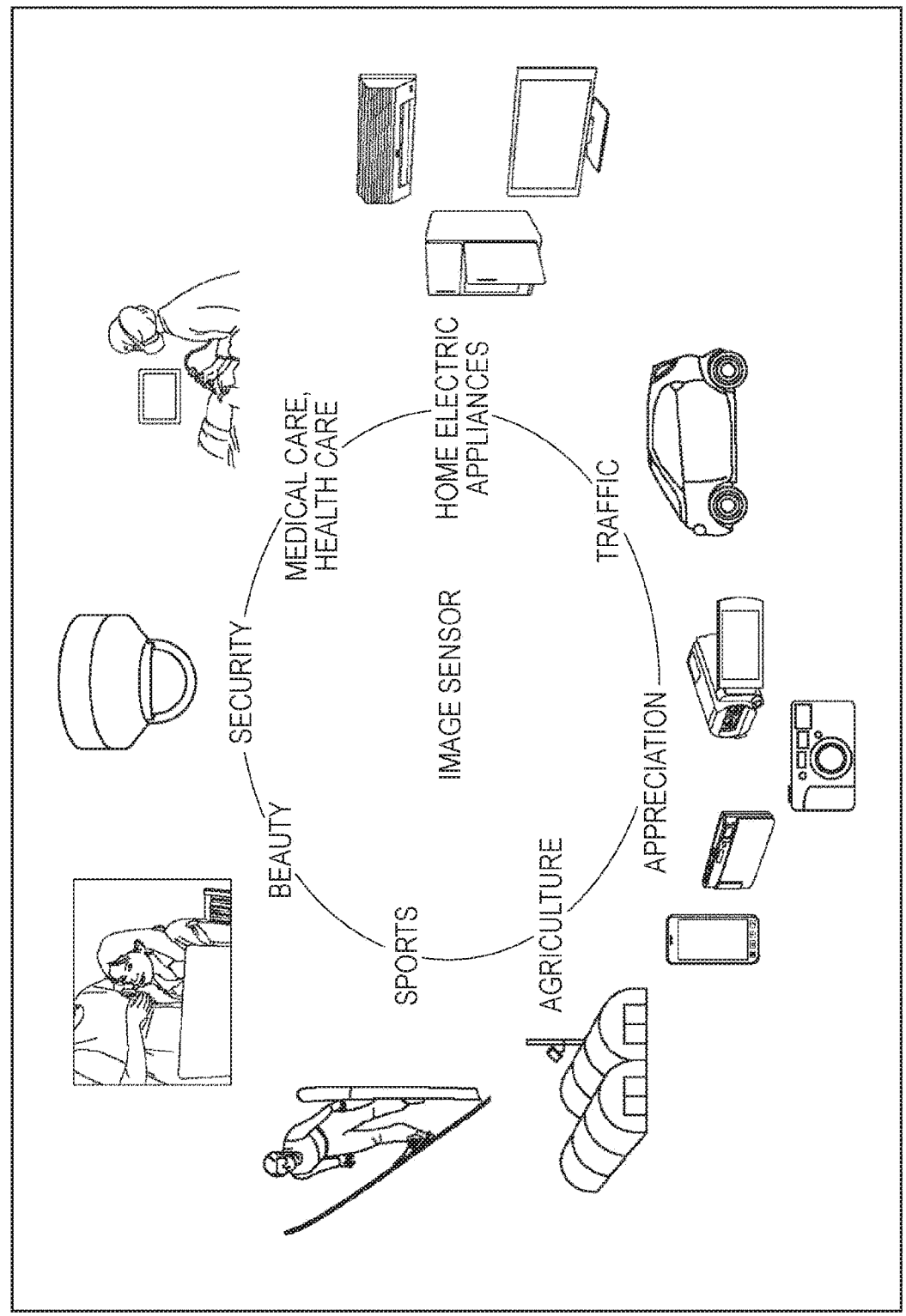
FIG. 32 is a drawing illustrating an example of using an image sensor to which the present technology is applied.

FIG. 32 is a drawing illustrating an example of using the above-described solid-state image pickup device.

The above-described solid-state image pickup device (image sensor) can be used for various cases of sensing light such as visible light, infrared light, ultraviolet light and X-ray, for example, as described below.

- A device for taking an image for appreciation, the device including a digital camera, a portable apparatus having a camera function, and the like
- A device for traffic purposes, the device including: for example, a vehicle-mounted sensor for imaging, for example, the front and rear of an automobile, and the surrounding and inside of the automobile, for the purposes of, for example, safe driving such as automatic stop, and the recognition of a state of a driver; a monitoring camera for monitoring traveling vehicles and roads; and a distance measuring sensor for measuring, for example, a distance between vehicles
- A device for imaging a gesture of a user to enable to perform apparatus operation according to the gesture, the device being used in a home electric appliance such as a TV, a refrigerator and an air conditioner
- A device used for medical care or health care, the device including an endoscope, a device for taking an image of blood vessels by receiving infrared light, and the like
- A device for security purposes, the device including a monitoring camera for security use, a camera used for person authentication, and the like
- A device for beauty purposes, the device including a skin measuring instrument for imaging skin, a microscope for imaging a scalp, and the like
- A device for sports purposes, the device including for example, a wearable camera and an action camera that are used for sports or the like
- A device for agricultural purposes, the device including a camera for monitoring a state of a field and a crop, and the like

3. Third Embodiment (Example of Electronic Apparatus)

Configuration Example of Electronic Apparatus

Moreover, the application of the present technology is not limited to the application to the solid-state image pickup device. The present technology can also be applied to an image pickup device. Here, the image pickup device includes: a camera system such as a digital still camera and a digital video camera; and an electronic apparatus having an image pickup function, such as a portable telephone. It should be noted that there is also a case where a module-like form provided in an electronic apparatus, that is to say, a camera module, is treated as an image pickup device.

Here, a configuration example of an electronic apparatus according to the present technology will be described with reference to FIG. 33.

Figure 33:
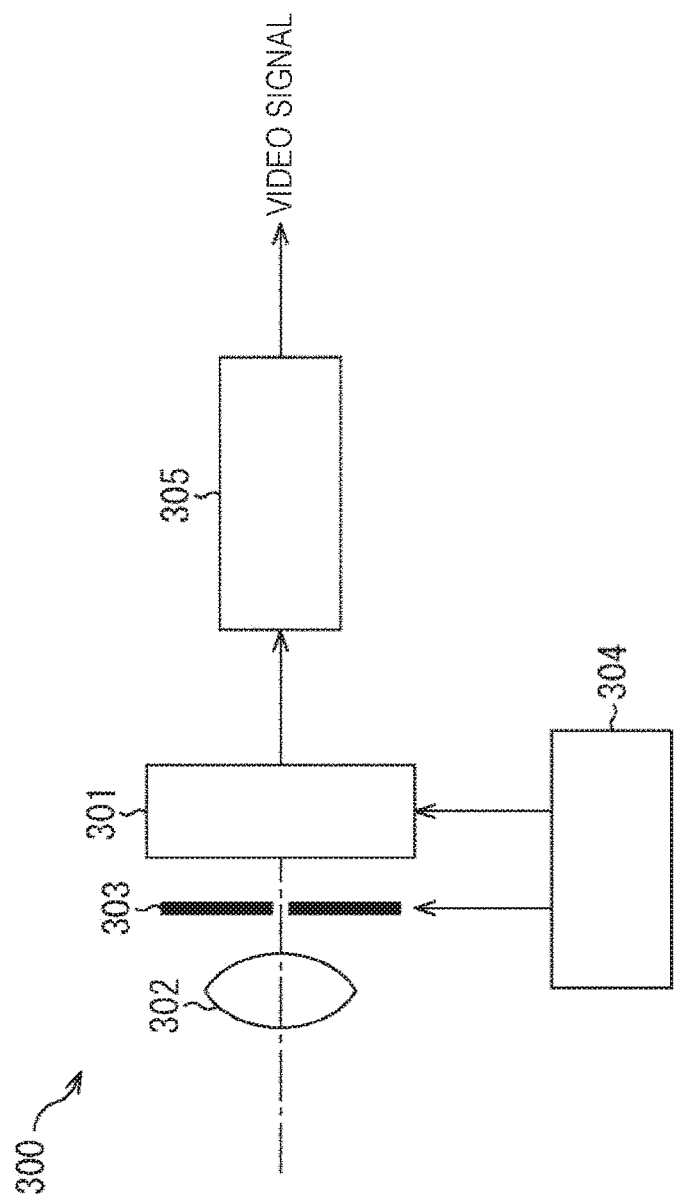
FIG. 33 is a block diagram illustrating a configuration example of an electronic apparatus to which the present technology is applied.

An electronic apparatus 300 shown in FIG. 33 is provided with a solid-state image pickup device (element chip) 301, an optical lens 302, a shutter device 303, a driving circuit 304, and a signal processing circuit 305. As the solid-state image pickup device 301, the solid-state image pickup device 1 according to the first embodiment of the present technology described above is provided. This enables to increase the area efficiency of the Si interface on the transistor element side of the solid-state image pickup device 301 of the electronic apparatus 300.

The optical lens 302 forms an image of image light (incident light) from an object on an image pickup surface of the solid-state image pickup device 301. As the result, a signal charge is accumulated in the solid-state image pickup device 301 for a fixed period of time. The shutter device 303 controls a light irradiation time period and a light shielding time period for the solid-state image pickup device 301.

The driving circuit 304 supplies a driving signal for controlling the signal transfer operation of the solid-state image pickup device 301, and a driving signal for controlling the shutter operation of the shutter device 303. The solid-state image pickup device 301 transfers a signal by the driving signal (timing signal) supplied from the driving circuit 304. The signal processing circuit 305 subjects the signal output from the solid-state image pickup device 301 to various kinds of signal processing. A video signal that has been subjected to the signal processing is stored in a storage medium such as a memory, or is output to a monitor.

It should be noted that in this specification, the step that describes the series of processing includes, of course, not only the processing that is performed according to the described order in a time-series manner, but also processing that is executed in parallel or individually even if the processing is not necessarily handled in a time-series manner.

In addition, the embodiments in the present disclosure are not limited to the embodiments described above. Various modifications can be made within the scope that does not deviate from the gist of the present disclosure.

Additionally, the configuration that has been explained as above as one device (or processing unit) may be divided so as to be configured as a plurality of devices (or processing units). In contrast, the configuration that has been explained as above as the plurality of devices (or processing units) may be put together so as to be configured as one device (or processing unit). Moreover, it is needless to say that a configuration other than those described above may be added to the configuration of each device (or each processing part). Furthermore, if the configuration and operation as a system as a whole are substantially the same, a part of a configuration of a certain device (or processing unit) may be included in a configuration of another device (or another processing unit). In other words, the present technology is not limited to the above-described embodiments, and various modifications can be made within the scope that does not deviate from the gist of the present technology.

The preferable embodiments of the present disclosure have been described in detail as above with reference to the accompanying drawings. However, the disclosure is not limited to the above-described examples. It is clear that if a person has ordinary skill in the technical field to which the present disclosure belongs, the person is able to conceive of various correction examples or modification examples within the category of the technical idea set forth in the claims. It should be understood that, of course, these examples also belong to the technical range of the present disclosure.

It should be noted that the present technology can also employ the following configurations.

(1) A solid-state image pickup device including:
a photodiode; and
a capacitance that is formed on the photodiode.

(2) The solid-state image pickup device set forth in the preceding (1), in which
the capacitance is an MOS capacitance that forms a poly.

(3) The solid-state image pickup device set forth in the preceding (1), in which
the capacitance is an n+ electrode on a hole accumulation layer.

(4) The solid-state image pickup device set forth in any of the preceding (1) to (3), in which
the capacitance is used for switching a conversion efficiency.

(5) The solid-state image pickup device set forth in any of the preceding (1) to (4), in which
during most of a light exposure time period, an electric potential of the electrode is kept at an electric potential lower than an electric potential obtained when the capacitance is actually used.

(6) The solid-state image pickup device set forth in the preceding (5), in which
when exposure to light is started, a reset drain electric potential is applied, a MOS gate or an n+ electrode, which is the capacitance, is set at a low electric potential through a reset transistor, and subsequently, by switching off a transistor connected between reset drain capacitances, the MOS gate or the n+ electrode is kept at the low electric potential.

(7) The solid-state image pickup device set forth in any of the preceding (1) to (6), in which
the photodiode is embedded into a deep region of a substrate, and a part used as the capacitance is separated by putting a distance in a depth direction.

(8) The solid-state image pickup device set forth in any of the preceding (1) to (7), in which
in a case of pixel sharing in which the photodiode is shared by two or more, a top of each photodiode is allocated to a capacitance, a transistor or a well contact.

(9) The solid-state image pickup device set forth in any of the preceding (1) to (8), in which
in a case of the MOS capacitance, the Si side under a MOS gate is formed to be high concentration p-type or n-type, and a region having CV characteristics, and having a satisfactory linearity, is used.

(10) The solid-state image pickup device set forth in the preceding (9), in which
in a case where the Si side is p-type, p+polySi, PtSi or NiSi is used as a gate electrode.

(11) The solid-state image pickup device set forth in the preceding (9) or (10), in which
in a case where the Si side is p-type, HfO2 or Al2O3 is used as a gate insulating film.

(12) The solid-state image pickup device set forth in the preceding (9), in which
in a case where the Si side is n-type, n+polySi, TaN or TiN is used as a gate electrode.

(13) The solid-state image pickup device set forth in the preceding (9) or (12), in which
in a case where the Si side is n-type, Y2O3 or La2O3 is used as a gate insulating film.

(14) The solid-state image pickup device set forth in the preceding (9), in which
the linearity is evaluated, and a bent part is corrected in a subsequent stage.

(15) The solid-state image pickup device set forth in the preceding (9) or (14), in which information about the linearity is recorded, the information being used for the correction.

(16) The solid-state image pickup device set forth in any of the preceding (1) to (15), in which the solid-state image pickup device is backside-illumination type.

(17) An electronic apparatus including:
a solid-state image pickup device including:
a photodiode; and
a capacitance that is formed on the photodiode;
a signal processing circuit that processes an output signal output from the solid-state image pickup device; and
an optical system that enters incident light into the solid-state image pickup device.

REFERENCE SIGNS LIST

1 Solid-state image pickup device
2 Pixel
3 Pixel region
5 Column signal processing circuit
50 PD unit
51 PD
52 FD
53 TG
54 Amp
55 RST
56 FDG
58 FC
10 SEL
101 FC
111 n+ region
112 n-type region
131 TG
141 TG
151 p-type region
161 FDG
162 n− region
171 FDG
172 well contact
181 Large PD
182 Small PD
211 TGL
212 FCG
213 TGS
251 TRG
300 Electronic apparatus
301 Solid-state image pickup device
302 Optical lens
303 Shutter device
304 Driving circuit
305 Signal processing circuit

The invention claimed is:
1. A solid-state image pickup device, comprising:
a photodiode;
a capacitance on the photodiode;
a floating diffusion;
a reset transistor; and
a specific transistor connected between the capacitance and the floating diffusion, wherein
the capacitance is connected to the floating diffusion and the capacitance is set at a first electric potential, when the specific transistor is switched on and a reset drain electric potential is at a first level, and
in a light exposure time period:
the capacitance is set at a second electric potential through the reset transistor, when the reset drain electric potential is at a second level and the specific transistor is switched on, and
the capacitance is held at the set second electric potential, when the specific transistor is switched off subsequent to the set of the capacitance at the second electric potential, wherein
the second level of the reset drain electric potential is lower than the first level of the reset drain electric potential, and
the second electric potential of the capacitance is lower than the first electric potential of the capacitance.

2. The solid-state image pickup device according to claim 1, wherein the capacitance is a metal oxide semiconductor (MOS) capacitance that comprises a poly.

3. The solid-state image pickup device according to claim 1, wherein the capacitance is an n+ electrode on a hole accumulation layer.

4. The solid-state image pickup device according to claim 1, wherein the capacitance is used for switching a conversion efficiency.

5. The solid-state image pickup device according to claim 1, wherein
the photodiode is embedded into a deep region of a substrate, and
a part of the substrate is used as a junction capacitance, based on the embedded photodiode.

6. The solid-state image pickup device according to claim 1, wherein in a case of pixel sharing in which the photodiode is shared, the photodiode is allocated to the capacitance, the specific transistor, or a well contact.

7. The solid-state image pickup device according to claim 1, wherein
the capacitance is a first metal oxide semiconductor (MOS) capacitance,
a MOS gate of the first MOS capacitance comprises one of a high concentration p-type silicon or a high concentration n-type silicon, and
a linearity of an output corresponding to the first MOS capacitance is higher than a linearity of an output corresponding to a second MOS capacitance having one of a low concentration p-type silicon or a low concentration n-type silicon.

8. The solid-state image pickup device according to claim 7, wherein when the MOS gate is the high concentration p-type silicon, a gate electrode of the MOS gate comprises one of p+polySi, PtSi, or NiSi.

9. The solid-state image pickup device according to claim 7, wherein when the MOS gate is the high concentration p-type silicon, a gate insulating film for the MOS gate comprises one of $HfO_2$ or $Al_2O_3$.

10. The solid-state image pickup device according to claim 7, wherein when the MOS gate is the high concentration n-type silicon, a gate electrode of the MOS gate comprises one of n+polySi, TaN, or TiN.

11. The solid-state image pickup device according to claim 7, wherein when the MOS gate is the high concentration n-type silicon, a gate insulating film for the MOS gate comprises one of $Y_2O_3$ or $La_2O_3$.

12. The solid-state image pickup device according to claim 7, wherein the linearity of the output corresponding to the first MOS capacitance is evaluated to correct a bend part of the output, corresponding to the first MOS capacitance, in a stage subsequent to signal lines of a pixel array.

13. The solid-state image pickup device according to claim 12, wherein linearity information is recorded for the correction of the bend part of the output corresponding to the first MOS capacitance.

14. The solid-state image pickup device according to claim 1, wherein the solid-state image pickup device is backside-illumination type.

15. An electronic apparatus, comprising:
a solid-state image pickup device including:
  a photodiode;
  a capacitance on the photodiode;
  a floating diffusion;
  a reset transistor; and
  a specific transistor connected between the capacitance and the floating diffusion, wherein
    the capacitance is connected to the floating diffusion and the capacitance is set at a first electric potential, when the specific transistor is switched on and a reset drain electric potential is at a first level, and
    in a light exposure time period:
      the capacitance is set at a second electric potential through the reset transistor, when the reset drain electric potential is at a second level and the specific transistor is switched on, and
      the capacitance is held at the set second electric potential, when the specific transistor is switched off subsequent to the set of the capacitance at the second electric potential, wherein
      the second level of the reset drain electric potential is lower than the first level of the reset drain electric potential, and
      the second electric potential of the capacitance is lower than the first electric potential of the capacitance;
a signal processing circuit that configured to process an output signal output from the solid-state image pickup device; and
an optical system configured to receive incident light into the solid-state image pickup device.

* * * * *